US011676922B2

(12) United States Patent
Weng et al.

(10) Patent No.: US 11,676,922 B2
(45) Date of Patent: Jun. 13, 2023

(54) INTEGRATED DEVICE COMPRISING INTERCONNECT STRUCTURES HAVING AN INNER INTERCONNECT, A DIELECTRIC LAYER AND A CONDUCTIVE LAYER

(71) Applicant: QUALCOMM Incorporated, San Diego, CA (US)

(72) Inventors: Li-Sheng Weng, San Diego, CA (US); Yue Li, San Diego, CA (US); Yangyang Sun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 11 days.

(21) Appl. No.: 16/665,883

(22) Filed: Oct. 28, 2019

(65) Prior Publication Data

US 2021/0125951 A1 Apr. 29, 2021

(51) Int. Cl.
*H01L 23/00* (2006.01)

(52) U.S. Cl.
CPC .............. *H01L 24/13* (2013.01); *H01L 24/11* (2013.01); *H01L 24/14* (2013.01); *H01L 2224/10122* (2013.01); *H01L 2224/1182* (2013.01); *H01L 2224/13564* (2013.01); *H01L 2224/13565* (2013.01); *H01L 2224/13582* (2013.01); *H01L 2224/14133* (2013.01); *H01L 2924/3025* (2013.01)

(58) Field of Classification Search
CPC ......... H01L 24/13; H01L 24/11; H01L 24/14; H01L 2224/13582; H01L 2224/14133; H01L 2224/13565; H01L 2924/3025; H01L 2224/13564; H01L 2224/10122; H01L 2224/1182; H01L 24/16; H01L 2224/131; H01L 2924/15311; H01L 21/4853; H01L 23/552; H01L 23/49811; H01L 2224/16227

See application file for complete search history.

(56) References Cited

U.S. PATENT DOCUMENTS

| 9,704,796 | B1 * | 7/2017 | Gu | ......................... H01L 23/642 |
| 10,446,466 | B1 * | 10/2019 | Milne | ..................... H01L 24/30 |
| 2008/0090405 | A1 * | 4/2008 | Fitzgerald | ............ B23K 35/286 |
|  |  |  |  | 438/612 |

(Continued)

FOREIGN PATENT DOCUMENTS

| EP | 1176641 A2 | 1/2002 |
| WO | 2015000596 A1 | 1/2015 |

OTHER PUBLICATIONS

International Search Report and Written Opinion—PCT/US2020/048875—ISA/EPO—dated Dec. 21, 2020.

*Primary Examiner* — Edward Chin
(74) *Attorney, Agent, or Firm* — Loza & Loza, LLP

(57) ABSTRACT

An integrated device that includes a substrate, an interconnect portion and an interconnect structure. The interconnect portion is located over the substrate. The interconnect portion includes a plurality of interconnects and at least one dielectric layer. The interconnect structure is located over the interconnect portion. The interconnect structure includes an inner interconnect, a dielectric layer coupled to the inner interconnect, and an outer conductive layer coupled to the dielectric layer. The outer conductive layer is configured to operate as a shield for the inner interconnect.

28 Claims, 26 Drawing Sheets

(56) References Cited

U.S. PATENT DOCUMENTS

| | | | |
|---|---|---|---|
| 2013/0341786 A1* | 12/2013 | Hsu | H01L 23/49811 |
| | | | 257/737 |
| 2015/0084194 A1* | 3/2015 | Molzer | H01L 23/481 |
| | | | 257/774 |
| 2015/0155256 A1* | 6/2015 | Lin | H01L 23/552 |
| | | | 257/737 |
| 2015/0305189 A1* | 10/2015 | Strader | H01L 23/3735 |
| | | | 165/185 |
| 2016/0133571 A1* | 5/2016 | Lee | H01L 24/19 |
| | | | 257/774 |
| 2016/0165755 A1* | 6/2016 | Bodenweber | H01L 23/46 |
| | | | 165/80.2 |
| 2016/0172302 A1 | 6/2016 | Song et al. | |
| 2016/0240503 A1* | 8/2016 | Shu | H01L 21/563 |
| 2016/0322343 A1* | 11/2016 | Scanlan | H01L 23/49827 |
| 2017/0047281 A1 | 2/2017 | Hu | |
| 2018/0216248 A1* | 8/2018 | Akbulut | F28F 13/00 |
| 2019/0148261 A1* | 5/2019 | Wu | H01L 21/4882 |
| | | | 257/684 |
| 2019/0304923 A1* | 10/2019 | Shekhar | H01F 17/0013 |
| 2019/0371700 A1* | 12/2019 | Yeh | H01L 23/3737 |
| 2020/0013691 A1* | 1/2020 | Liu | G01N 29/24 |
| 2020/0091128 A1* | 3/2020 | Elsherbini | H01L 24/17 |
| 2020/0105731 A1* | 4/2020 | Aleksov | H01L 24/83 |
| 2020/0211943 A1* | 7/2020 | Langari | H01L 24/16 |
| 2021/0125951 A1* | 4/2021 | Weng | H01L 24/11 |

* cited by examiner

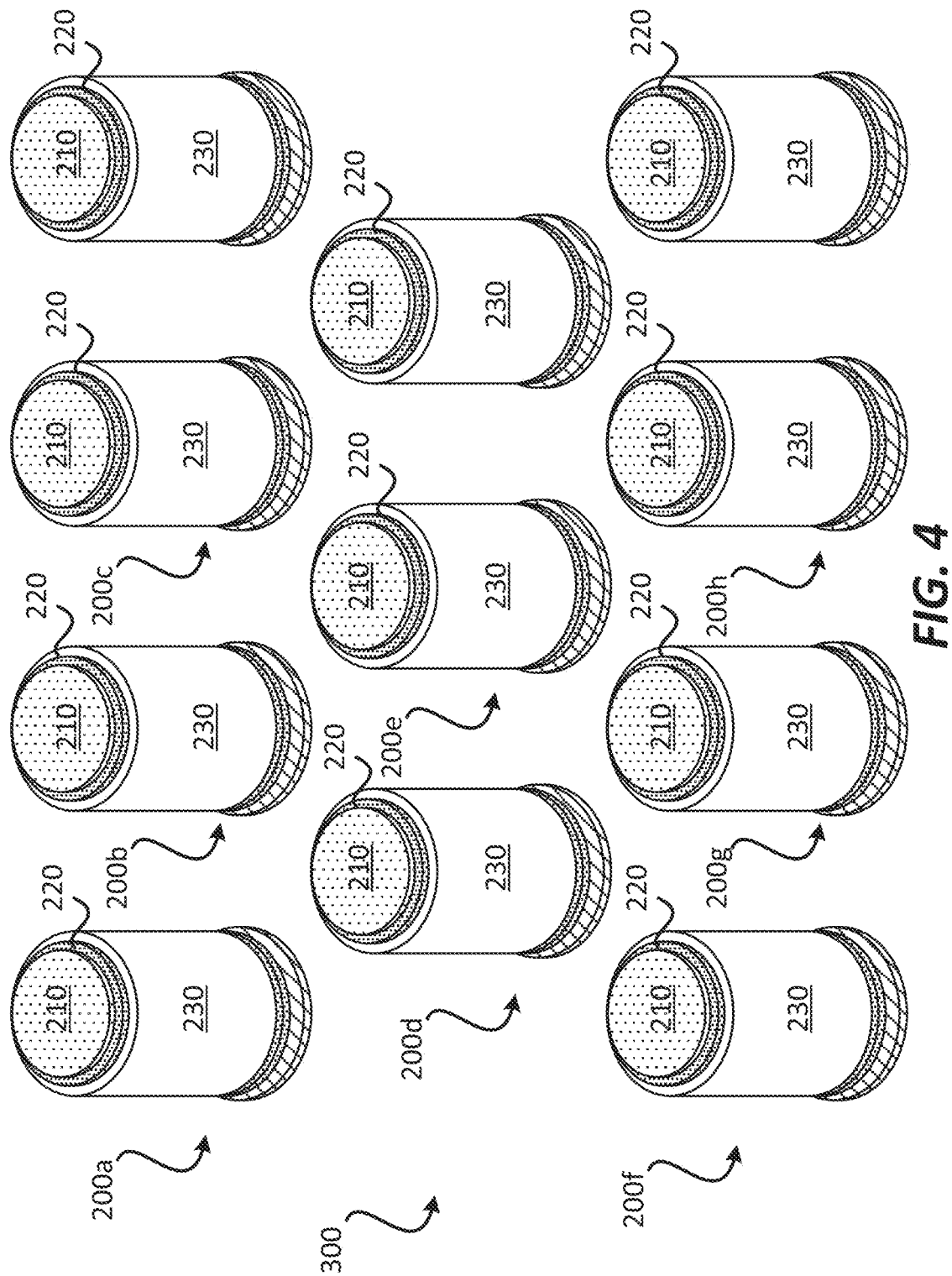

PROFILE VIEW

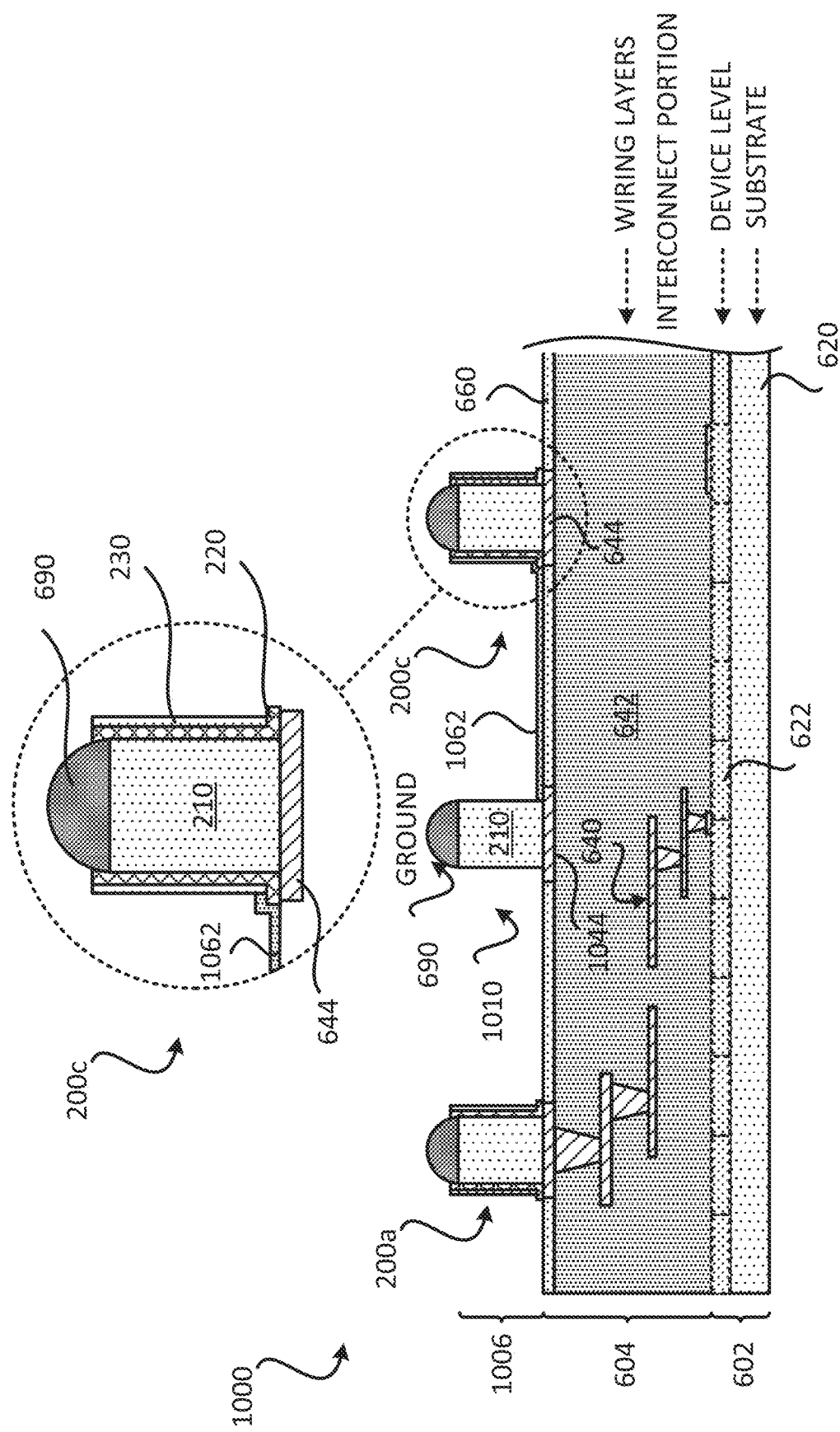

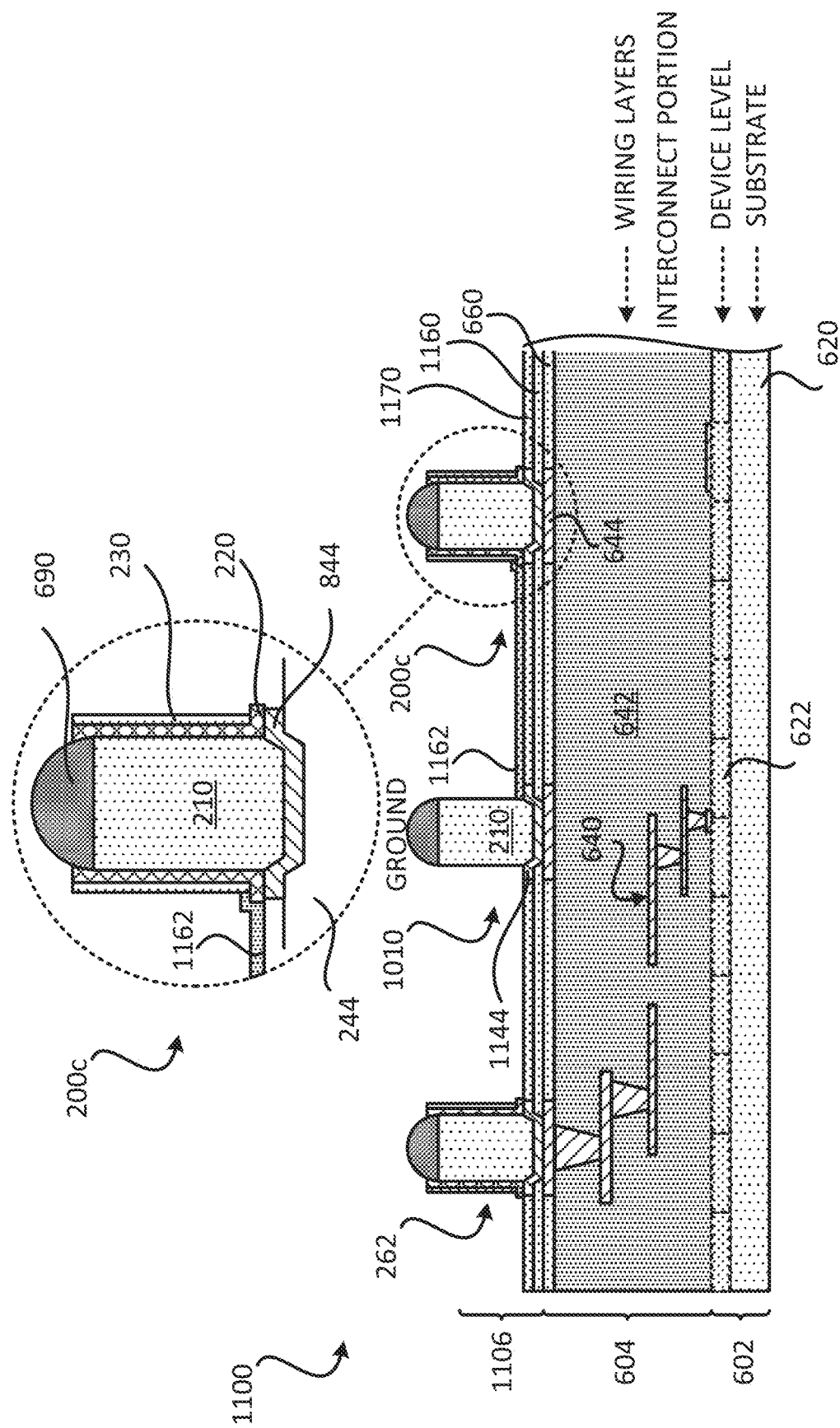

PROFILE VIEW

INTEGRATED DEVICE COMPRISING INTERCONNECT STRUCTURES HAVING AN INNER INTERCONNECT, A DIELECTRIC LAYER AND A CONDUCTIVE LAYER

FIELD

Various features relate to integrated devices that include interconnects, but more specifically to integrated devices that include interconnect structures having an inner interconnect, a dielectric layer and a conductive layer.

BACKGROUND

FIG. 1 illustrates a package 100 that includes a die 102, a substrate 104 and an encapsulation layer 106. The die 102 is coupled to the substrate 104. The encapsulation layer 106 is formed over the substrate 104. The encapsulation layer 106 encapsulates the die 102. The substrate 104 includes a plurality of interconnects 140. A plurality of solder interconnects 130 is coupled to the substrate 104 through the plurality of interconnects 140 of the substrate 104. There is an ongoing need to provide devices with improved performance.

SUMMARY

Various features relate to integrated devices that include interconnects, but more specifically to integrated devices that include interconnect structures having an inner interconnect, a dielectric layer and a conductive layer.

One example provides an integrated device that includes a substrate, an interconnect portion and an interconnect structure. The interconnect portion is located over the substrate. The interconnect portion includes a plurality of interconnects and at least one dielectric layer. The interconnect structure is located over the interconnect portion. The interconnect structure includes an inner interconnect, a dielectric layer coupled to the inner interconnect, and an outer conductive layer coupled to the dielectric layer. The outer conductive layer is configured to operate as a shield for the inner interconnect.

Another example provides an apparatus that includes a substrate; an integrated device coupled to the substrate; and means for shielded interconnect coupled to the substrate, wherein the means for shielded interconnect is configured to provide an electrical path for a signal such that the signal is shielded as the signal travels through the means for shielded interconnect.

Another example provides a device that includes a substrate; an integrated device coupled to the substrate; and an interconnect structure coupled to the substrate. The interconnect structure is configured to provide an electrical path for a signal such that the signal is shielded as the signal travels through the interconnect structure. The interconnect structure includes an inner interconnect; a dielectric layer coupled to the inner interconnect; and an outer conductive layer coupled to the dielectric layer. The outer conductive layer is configured to operate as a shield for the inner interconnect.

Another example provides a method for fabricating an integrated device. The method provides a substrate. The method forms an interconnect portion over the substrate. The method forms an interconnect structure over the interconnect portion. The interconnect structure includes an inner interconnect; a dielectric layer coupled to the inner interconnect; and an outer conductive layer coupled to the dielectric layer. The outer conductive layer is configured to operate as a shield for the inner interconnect.

BRIEF DESCRIPTION OF THE DRAWINGS

Various features, nature and advantages may become apparent from the detailed description set forth below when taken in conjunction with the drawings in which like reference characters identify correspondingly throughout.

FIG. 4 illustrates a view of a plurality of interconnect structures that include an inner interconnect, a dielectric layer and a conductive layer.

FIG. 10 illustrates a profile view of an exemplary integrated device that includes an interconnect structure having an inner interconnect, a dielectric layer and a conductive layer.

FIG. 11 illustrates a profile view of an exemplary integrated device that includes an interconnect structure having an inner interconnect, a dielectric layer and a conductive layer.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device that includes a substrate, an interconnect portion and an interconnect structure. The interconnect portion is located over the substrate. The interconnect portion includes a plurality of interconnects and at least one dielectric layer. The interconnect structure is located over the interconnect portion. The interconnect structure includes an inner interconnect, a dielectric layer coupled to the inner interconnect, and an outer conductive layer coupled to the dielectric layer. The outer conductive layer may include an electrically conductive layer. The outer conductive layer is configured to operate as a shield (e.g., electromagnetic interference (EMI) shield) for the inner interconnect. The interconnect structure may be a shielded interconnect structure. As will be further described below, the use of an interconnect structure that includes an outer conductive layer that is configured to operate as a shield (e.g., EMI shield) for the inner interconnect, may provide an integrated device with less cross talks between interconnects, and thus provides improved signal integrity in the integrated device. Cross talk may further be reduced when multiple interconnect structures that each includes an outer conductive layer that is configured to operate as a shield for the inner interconnect, are implemented with the integrated device.

Figure 2:
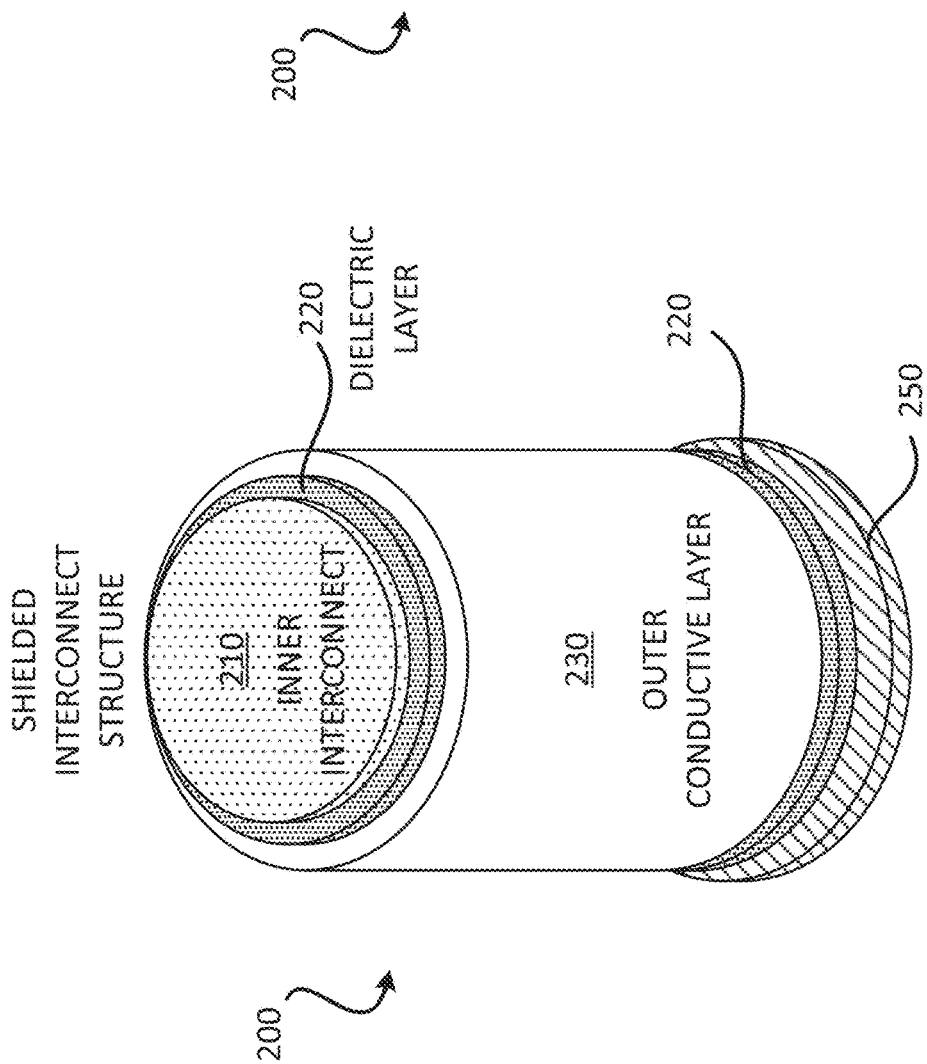
FIG. 2 illustrates a view of an exemplary interconnect structure that includes an inner interconnect, a dielectric layer and a conductive layer.

Exemplary Interconnect Structure Comprising an Inner Interconnect, a Dielectric Layer and an Outer Conductive Layer FIG. 2 illustrates an interconnect structure 200 that may be implemented with an integrated device and/or a package. The interconnect structure 200 may be configured as a shielded interconnect structure. The interconnect structure 200 may be a means for shielded interconnect. The interconnect structure 200 is configured to provide an electrical path with improved signal integrity. As will be further described below, the interconnect structure 200 (e.g., means for shielded interconnect) may be configured to provide an electrical path for a signal (input/output signal) such that the signal is shielded as the signal travels through the interconnect structure 200. The signal that travels through the interconnect structure 200 may be shielded from electromagnetic interfere (EMI) that may originate from signals that travel through other interconnects, components and/or devices.

Figure 1:
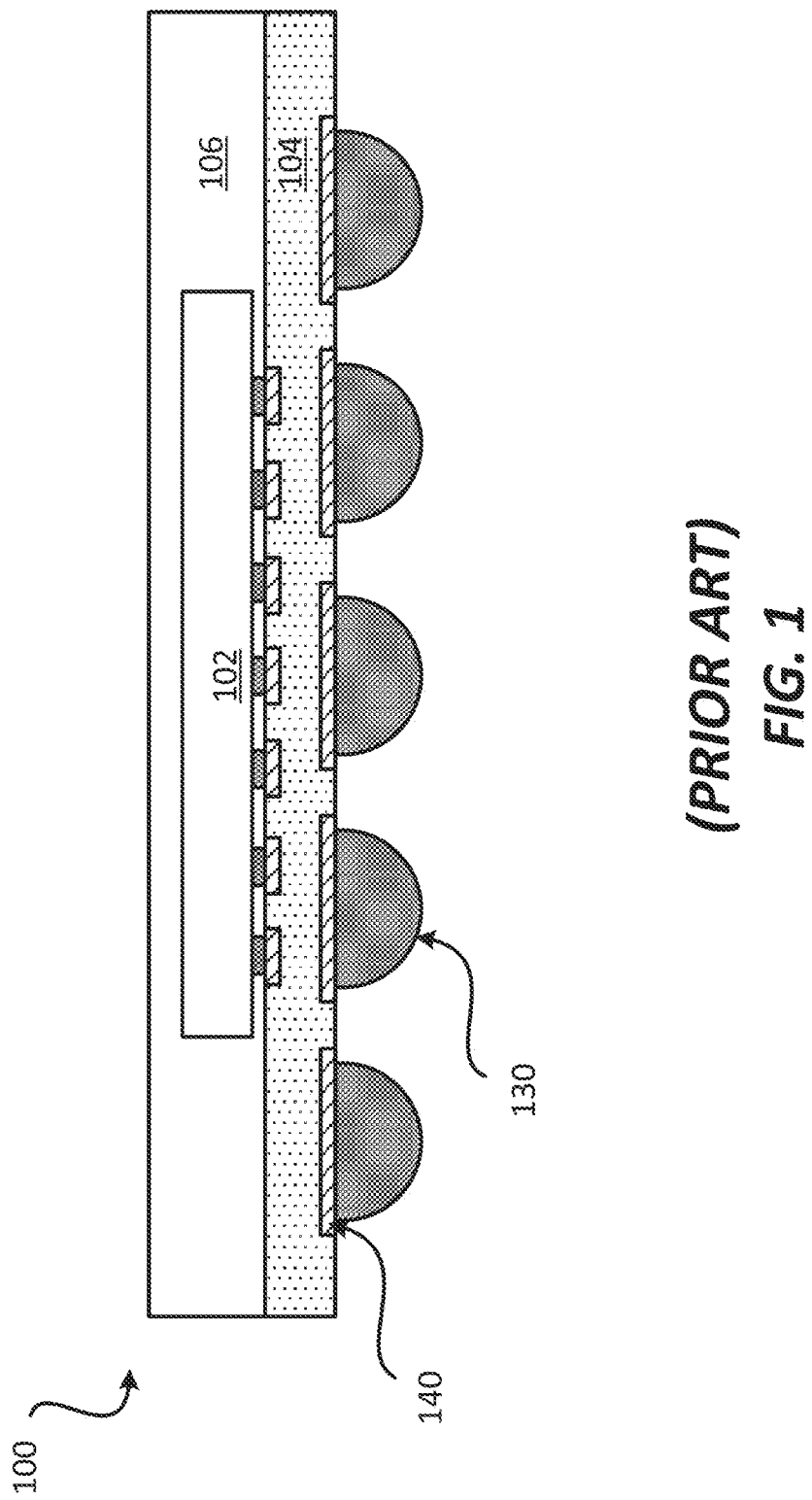
FIG. 1 illustrates a profile view of an integrated device that includes solder interconnects.
Figure 3:
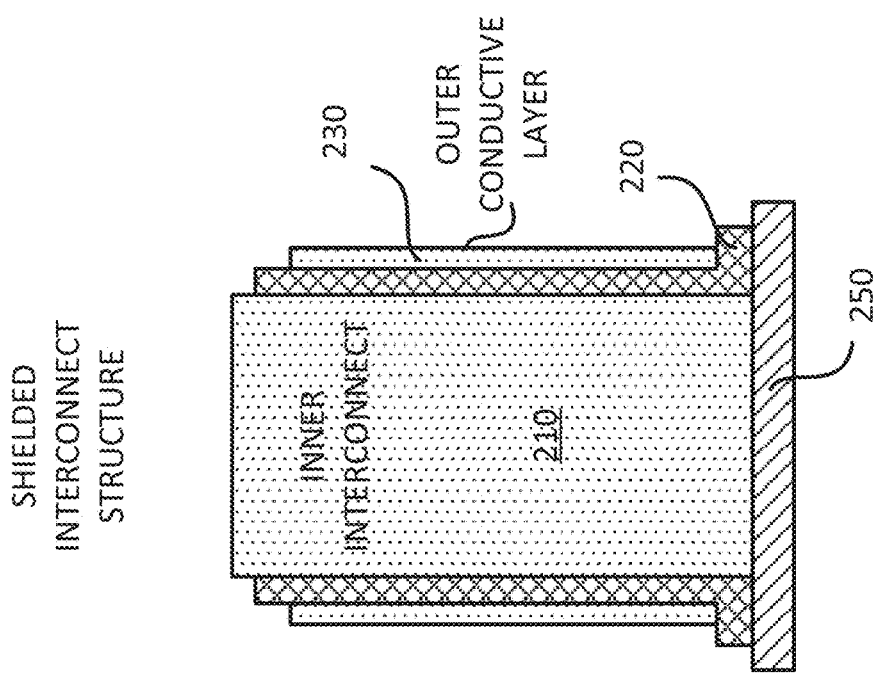
FIG. 3 illustrates a profile view of an exemplary interconnect structure that includes an inner interconnect, a dielectric layer and a conductive layer.

As shown in FIGS. 2 and 3, the interconnect structure 200 includes an inner interconnect 210, a dielectric layer 220, and an outer conductive layer 230. The dielectric layer 220 is coupled to the inner interconnect 210 such that the dielectric layer 220 surrounds a lateral side of (e.g., laterally surrounds) the inner interconnect 210. The outer conductive layer 230 is coupled to the dielectric layer 220 such that the outer conductive layer 230 surrounds a lateral side of (e.g., laterally surrounds) the dielectric layer 220. The dielectric layer 220 is between the inner interconnect 210 and the outer conductive layer 230. The outer conductive layer 230 may laterally surround the inner interconnect 210. The outer conductive layer 230 may include an electrically conductive layer. The outer conductive layer 230 is configured to not be in electrical contact with the inner interconnect 210. The outer conductive layer 230 may be configured to operate as a shield for the inner interconnect 210, thereby providing improved isolation of signals traveling through the inner interconnect 210. For example, the outer conductive layer 230 may be configured to provide EMI shielding for the inner interconnect 210. In some implementations, the outer conductive layer 230 may be coupled to ground. The inner interconnect 210 may include metal, such as copper. The inner interconnect 210 may be a pillar (e.g., pillar interconnect, copper pillar). The outer conductive layer 230 may include metal, such as copper. The dielectric layer 220 may include a photo-sensitive dielectric layer, such as a $SiO_2$ based material, and/or combinations thereof. The interconnect structure 200 may be coupled to an interconnect (e.g., pad 250). In particular, the inner interconnect 210 of the interconnect structure 200 is coupled to the pad 250. The pad 250 may be an interconnect from an integrated device and/or a substrate. The interconnect structure 200 may be a bump interconnect structure. As will be further described below, one or more of the interconnect structures 200 may be coupled to an integrated device, a substrate, a package and/or a printed circuit board (PCB).

FIG. 4 illustrates a plurality of interconnect structures 300. The plurality of interconnects structures 300 includes interconnect structures 200a-200h (e.g., first interconnect structure, second interconnect structure, third interconnect structure, etc.). The plurality of interconnect structures 300 are arranged in rows and/or columns of interconnect structures 200 (e.g., 200a-200h). The plurality of interconnect structures 300 may be configured to provide electrical paths for input/output (I/O) signals. Because the interconnect structures 200a-200h are close to each other, there is potential for a lot of cross talk between signals that travel through the interconnect structures 200a-200h. However, since each interconnect structure (e.g., 200a-200h) includes an outer conductive layer 230 that is configured to operate as a shield (e.g., EMI shield), the amount of cross talk between signals traveling through the interconnect structures 200 is reduced and minimized, thereby providing improved signal integrity for the integrated device. The plurality of interconnect structures 300 may be coupled to an integrated device, a substrate, a package and/or a printed circuit board (PCB).

Figure 5:
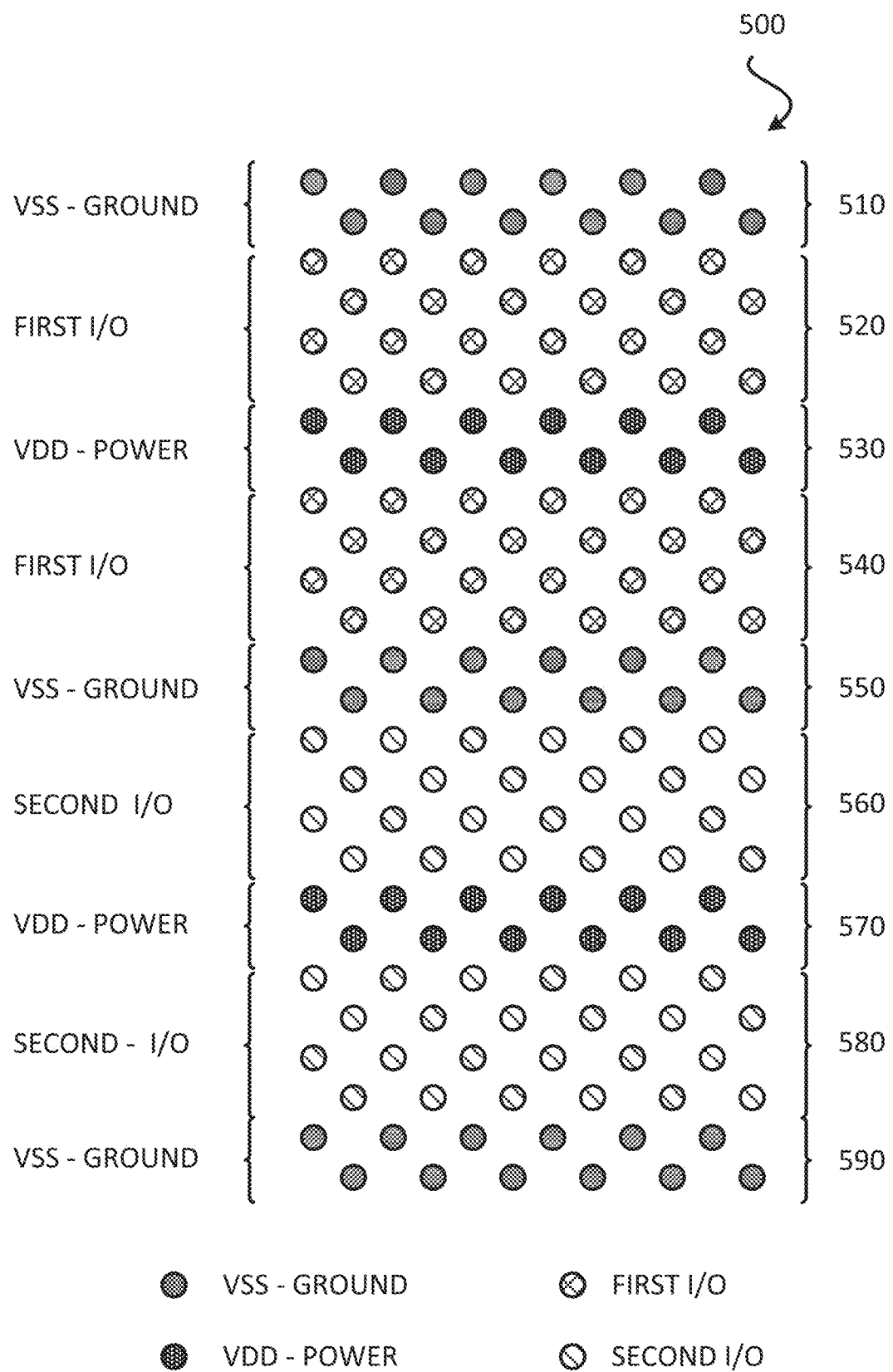
FIG. 5 illustrates a view of an arrangement of interconnects.

FIG. 5 illustrates an arrangement of interconnects 500. The arrangement of interconnects 500 may represent an arrangement of interconnects between (i) an integrated device and a substrate, (ii) an integrated device and a PCB, and/or (iii) a substrate and PCB. However, the arrangement of interconnects 500 may represent interconnects between other components and/or devices. In some implementations, one or more of the interconnects from the arrangement of interconnects 500 may include pillar interconnects (e.g., bump). One or more of the interconnects from the arrangement of interconnects 500 may include the interconnect structure 200.

As shown in FIG. 5, the arrangement of interconnects 500 includes a first plurality of interconnects 510, a second plurality of interconnects 520, a third plurality of interconnects 530, a fourth plurality of interconnects 540, a fifth plurality of interconnects 550, a sixth plurality of interconnects 560, a seventh plurality of interconnects 570, an eighth plurality of interconnects 580, and a ninth plurality of interconnects 590.

The first plurality of interconnects 510 is configured to provide electrical paths for ground. The second plurality of interconnects 520 is configured to provide electrical paths for first I/O signals. The third plurality of interconnects 530 is configured to provide electrical paths for power. The fourth plurality of interconnects 540 is configured to provide electrical paths for first I/O signals. The fifth plurality of interconnects 550 is configured to provide electrical paths for ground. The sixth plurality of interconnects 560 is configured to provide electrical paths for second I/O signals. The seventh plurality of interconnects 570 is configured to provide electrical paths for power. The eighth plurality of interconnects 580 is configured to provide electrical paths for second I/O signals. The ninth plurality of interconnects 590 is configured to provide electrical paths for ground.

In some implementations, the second plurality of interconnects 520, the fourth plurality of interconnects 540, the sixth plurality of interconnects 560, and/or the eight plurality of interconnects 580 may include one or more interconnect structures 200. When one or more interconnect structures 200 are used in the second plurality of interconnects 520, the fourth plurality of interconnects 540, the sixth plurality of interconnects 560, and/or the eight plurality of interconnects 580, the cross talk between signals traveling through the interconnects is reduced and minimized, thereby improving the signal integrity of the signals (e.g., first I/O signals, second I/O signals). It is noted that the interconnect structure 200 may also be implemented in the first plurality of interconnects 510, the third plurality of interconnects 530, the fifth plurality of interconnects 550, the seventh plurality of interconnects 570, and/or the ninth plurality of interconnects 590.

Figure 6:
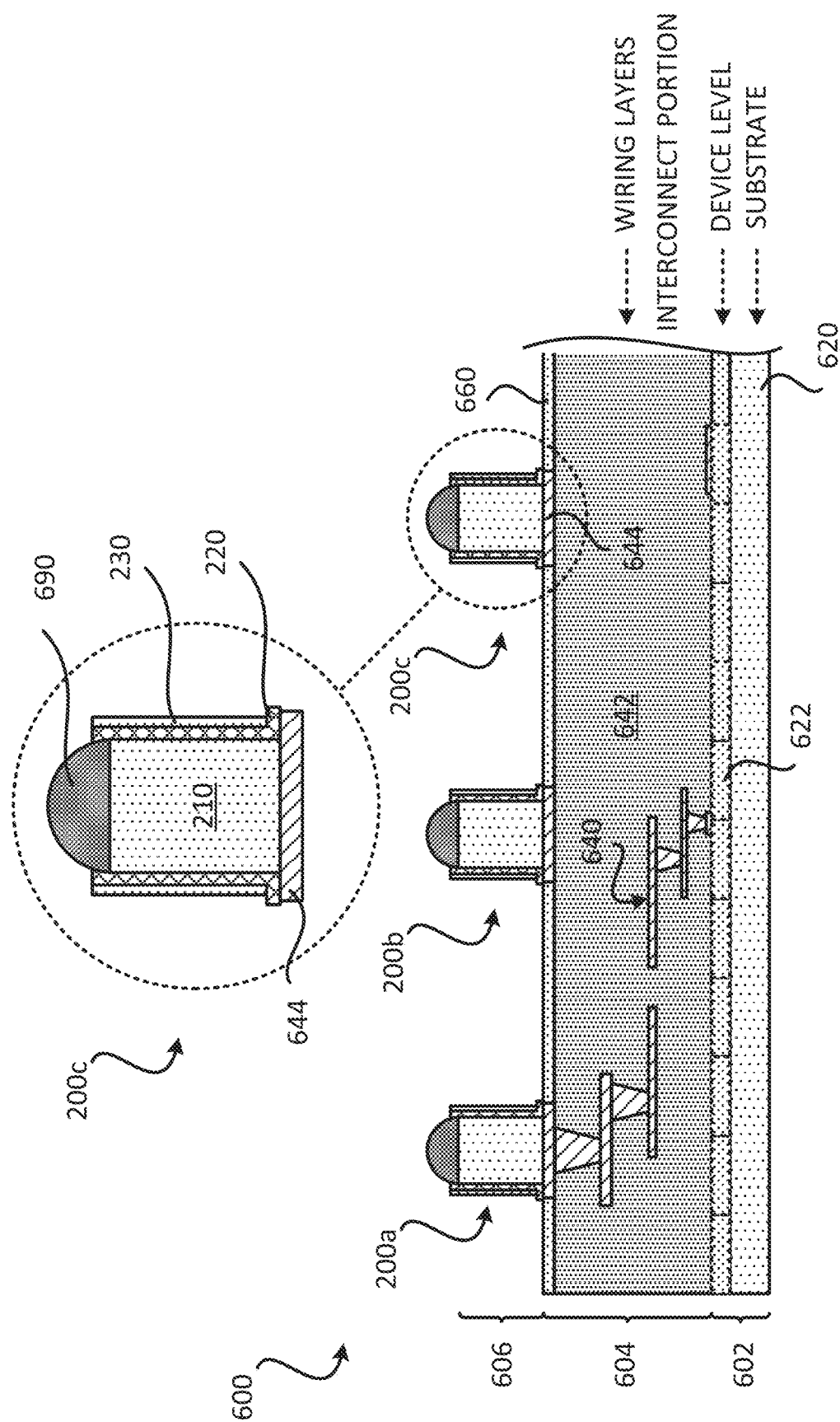
FIG. 6 illustrates a profile view of an exemplary integrated device that includes an interconnect structure having an inner interconnect, a dielectric layer and a conductive layer.

Exemplary Integrated Device Comprising Interconnect Structure Having an Inner Interconnect, a Dielectric Layer and an Outer Conductive Layer FIG. 6 illustrates an integrated device 600 that includes interconnect structures having an inner interconnect 210, a dielectric layer 220, and an outer conductive layer 230. The integrated device 600 includes a substrate 620, a plurality of device level cells 622, an interconnect portion 604, and a packaging portion 606. The plurality of device level cells 622 is formed over the substrate 620. The plurality of device level cells 622 may form the device level layer of the integrated device 600. In some implementations, the plurality of device level cells 622 may include portions of the substrate 620. In some implementations, the substrate 620, the device level layer and the plurality of device level cells 622 may be referred as the substrate portion 602 of the integrated device 600. The plurality of device level cells 622 may include logical cells and/or transistors that are part of a circuit.

The interconnect portion 604 is located over the substrate portion 602. In particular, the interconnect portion 604 is located over the plurality of device level cells 622 and the substrate 620. The interconnect portion 604 includes wiring layers. The interconnect portion 604 includes a plurality of interconnects 640 (e.g., trace, pad, vias) and at least one dielectric layer 642. The plurality of interconnects 640 may form the wiring layers of the interconnect portion 604.

A packaging portion 606 is formed over the interconnect portion 604. The packaging portion 606 includes a dielectric layer 660 and interconnect structures 200a-200c. Each of the interconnect structures 200a-200c may be coupled to an interconnect (e.g., pad 644), which may be part of the plurality of interconnects 640. The interconnect structure (e.g., 200a-200c) may be located over the interconnect portion 604 and/or an interconnect of the interconnect portion 604. The interconnect structures 200a-200c may be configured to provide electrical paths for one or more I/O signals. A solder interconnect 690 is coupled to the interconnect structure 200c. In particular, the solder interconnect 690 is coupled to the inner interconnect 210.

Figure 7:
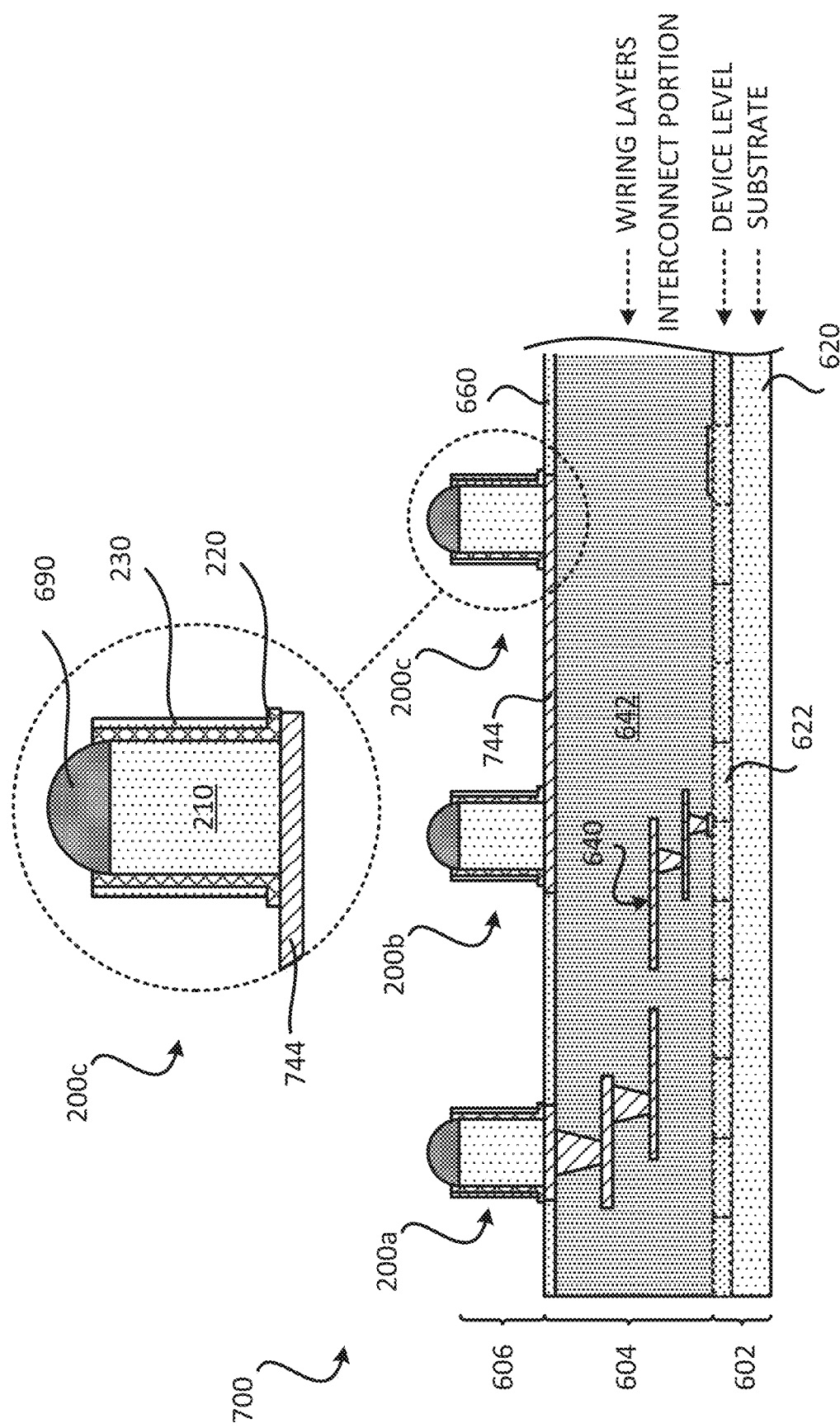
FIG. 7 illustrates a profile view of an exemplary integrated device that includes an interconnect structure having an inner interconnect, a dielectric layer and a conductive layer.

FIG. 7 illustrates another integrated device 700 that includes interconnect structures having an inner interconnect 210, a dielectric layer 220, and an outer conductive layer 230. The integrated device 700 is similar to the integrated device 600 of FIG. 6, and may include similar components as the integrated device 600. The integrated device 700 includes the interconnect structures 200a-200c. As shown in FIG. 7, the interconnect structure 200b is coupled to the interconnect 744, which is coupled to the interconnect structure 200c. The interconnect 744 may be considered part of the plurality of interconnects 640.

Figure 8:
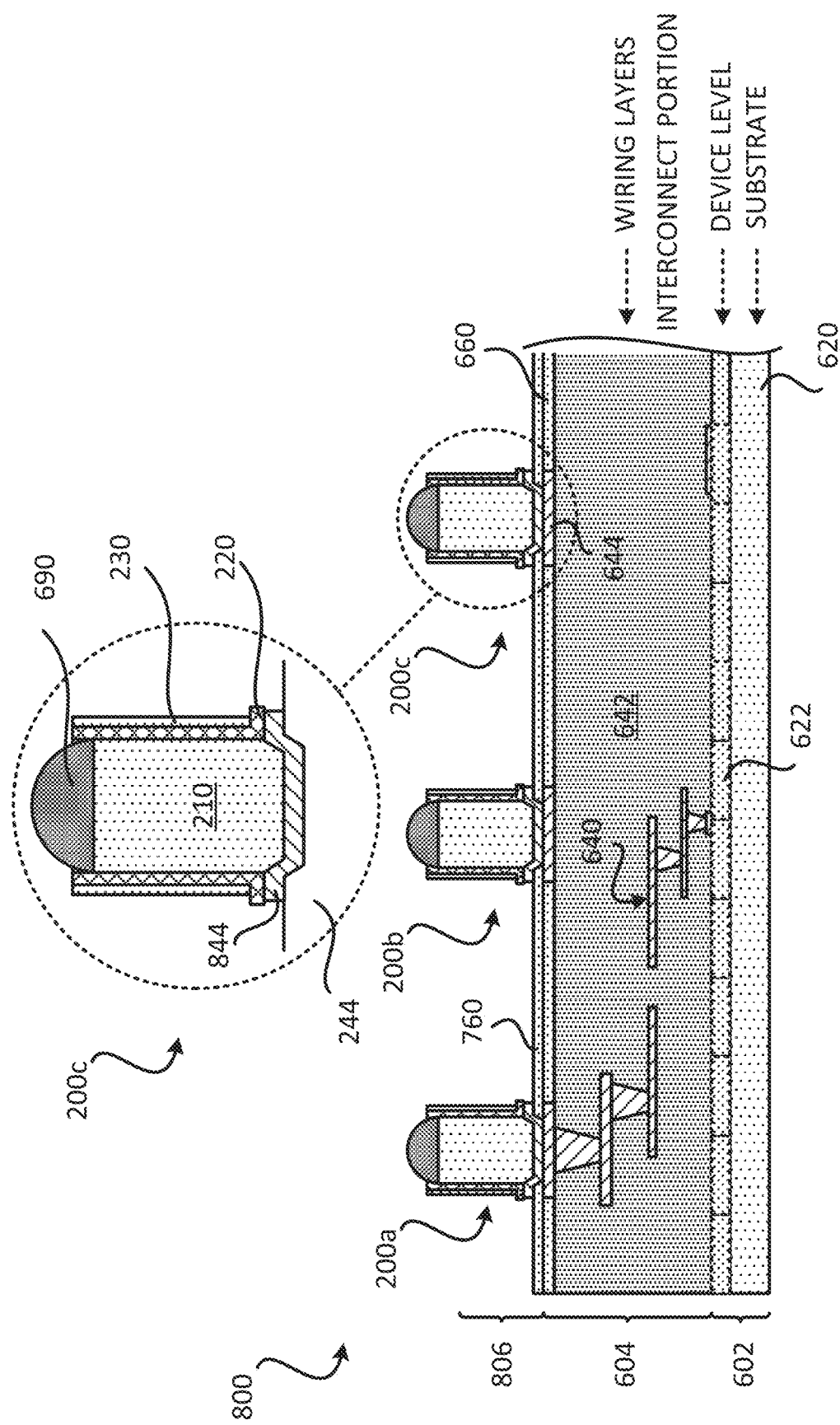
FIG. 8 illustrates a profile view of an exemplary integrated device that includes an interconnect structure having an inner interconnect, a dielectric layer and a conductive layer.

FIG. 8 illustrates another integrated device 800 that includes interconnect structures having an inner interconnect 210, a dielectric layer 220, and an outer conductive layer 230. The integrated device 800 is similar to the integrated device 600 of FIG. 6, and may include similar components as the integrated device 600. The integrated device 800 includes a packaging portion 806 that is coupled to the interconnect portion 604. The packaging portion 806 includes the pad 644, an under bump metallization (UBM) 844, the dielectric layer 660, a dielectric layer 760, and the interconnect structures 200a-200c. The dielectric layer 660 and/or the dielectric layer 760 may be a passivation layer. As shown in FIG. 8, the interconnect structure 200c is coupled to the under bump metallization (UBM) 844. In particular, the inner interconnect 210 is coupled to the UBM 844. The UBM 844 is coupled to the pad 644. The interconnect structure 200c is located over the interconnect portion 604.

Figure 9:
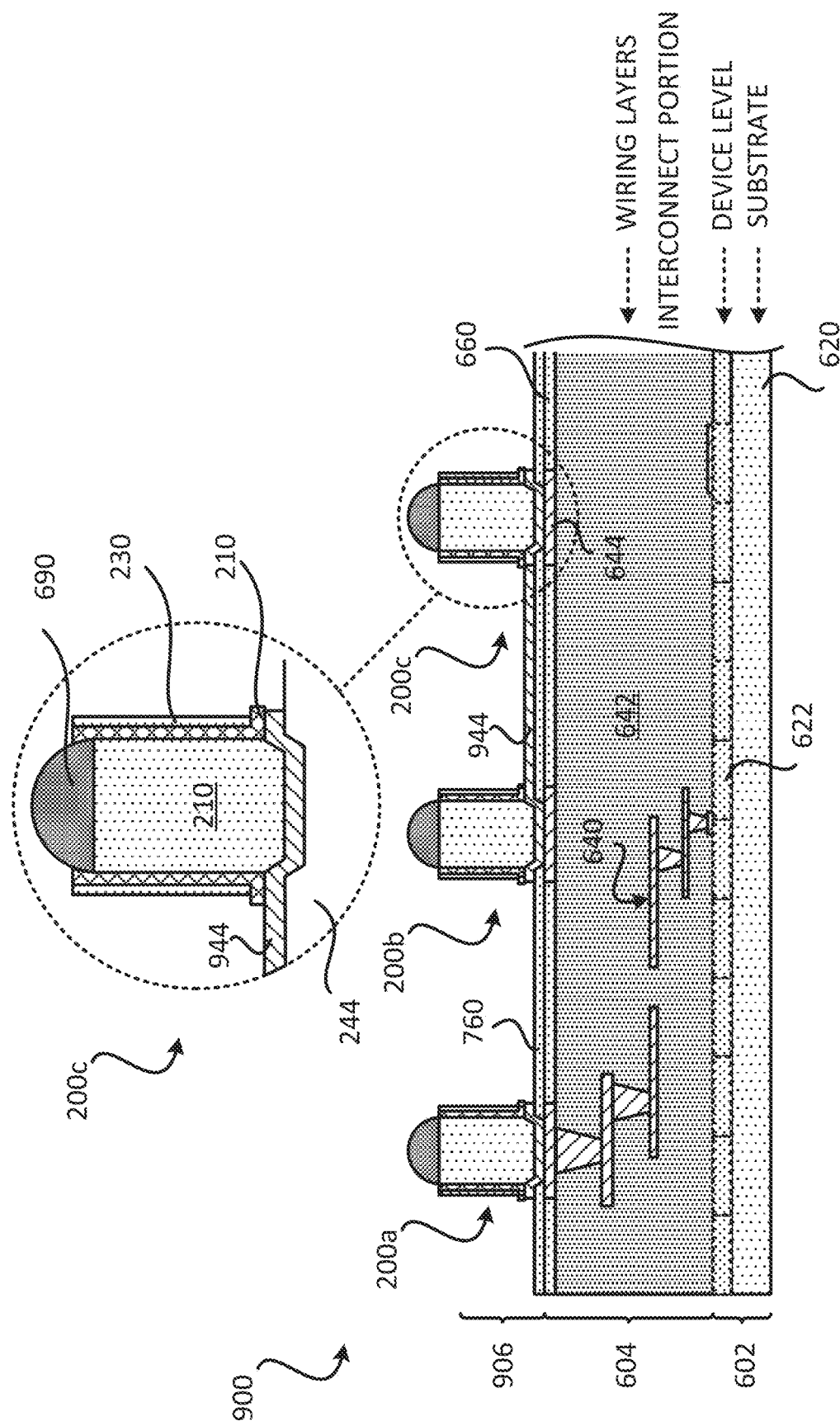
FIG. 9 illustrates a profile view of an exemplary integrated device that includes an interconnect structure having an inner interconnect, a dielectric layer and a conductive layer.

FIG. 9 illustrates another integrated device 900 that includes interconnect structures having an inner interconnect 210, a dielectric layer 220, and an outer conductive layer 230. The integrated device 900 is similar to the integrated device 800 of FIG. 8, and may include similar components as the integrated device 800. The integrated device 900 includes a packaging portion 906 that includes a UBM 944, the dielectric layer 660, the dielectric layer 760, and the interconnect structures 200a-200c. As shown in FIG. 9, the interconnect structure 200b is coupled to the UBM 944, which is coupled to the interconnect structure 200c.

FIG. 10 illustrates another integrated device 1000 that includes interconnect structures having an inner interconnect 210, a dielectric layer 220, and an outer conductive layer 230. The integrated device 1000 is similar to the integrated device 600 of FIG. 6, and may include similar components as the integrated device 600. The integrated device 1000 includes a packaging portion 1006 that is coupled to the interconnect portion 604. The packaging portion 1006 includes a pillar interconnect 1010, the interconnect structures 200a and 200c and an interconnect 1062 (e.g., packaging interconnect). The pillar interconnect 1010 includes the inner interconnect 210 and the solder interconnect 690. The pillar interconnect 1010 may be coupled to a pad 1044. The pillar interconnect 1010 may be configured to provide an electrical path for ground. As shown in FIG. 10, the inner interconnect 210 of the interconnect structure 200c is coupled to the pad 644. The outer conductive layer 230 of the interconnect structure 200c is coupled to the interconnect 1062 (e.g., packaging interconnect). The interconnect 1062 is coupled to the inner interconnect 210 of the pillar interconnect 1010 and/or the pad 1044. Since the pillar interconnect 1010 is configured to provide an electrical path for ground and/or configured to be coupled to ground, the outer conductive layer 230 of the interconnect structure 200c is also configured to be coupled to ground. When the outer conductive layer 230 of the interconnect structure 200c is configured to be coupled to ground, it helps provide better isolation for signals (e.g., I/O signals) traveling through the interconnect structure 200c.

FIG. 11 illustrates another integrated device 1100 that includes interconnect structures having an inner interconnect 210, a dielectric layer 220, and an outer conductive layer 230. The integrated device 1100 is similar to the integrated device 800 of FIG. 8, and may include similar components as the integrated device 800. The integrated device 1100 includes a packaging portion 1106 that is coupled to the interconnect portion 604. The packaging portion 1106 includes the pillar interconnect 1010, the interconnect structures 200a, 200c, an interconnect 1162 (e.g., packaging interconnect) and a dielectric layer 1170. The pillar interconnect 1010 includes the inner interconnect 210 and the solder interconnect 690. The pillar interconnect 1010 may be coupled to a UBM 1144.

The pillar interconnect 1010 may be configured to provide an electrical path for ground and/or configured to be coupled to ground. As shown in FIG. 11, the inner interconnect 210 of the interconnect structure 200c is coupled to the UBM 844. The outer conductive layer 230 of the interconnect structure 200c is coupled to the interconnect 1162 (e.g., packaging interconnect, UBM). The interconnect 1162 is coupled to the inner interconnect 210 of the pillar interconnect 1010 and/or the UBM 1144. Since the pillar interconnect 1010 is configured to be coupled to ground, the outer conductive layer 230 of the interconnect structure 200c is also configured to be coupled to ground. When the outer conductive layer 230 of the interconnect structure 200c is configured to be coupled to ground, it helps provide better isolation for signals traveling through the interconnect structure 200c.

FIGS. 2-4 and 6-11 illustrate that the inner interconnect 210 of an interconnect structure is coupled to an interconnect (e.g., 250, 644, 844, 944) without the need of a solder interconnect between the inner interconnect 210 and the interconnect of the interconnect portion 604 and/or interconnect of a packaging portion. Thus, in some implementations, the inner interconnect 210 of an interconnect structure may be coupled to an interconnect of the interconnect portion (e.g., 604) and/or a packaging portion (e.g., 904), such that the joint between inner interconnect 210 and the interconnect (e.g., 644, 844) is free of solder interconnect. It is noted that the integrated devices of FIGS. 6-11 may include other interconnect structures and/or pillar interconnects that may be configured to provide electrical paths for ground, power and/or I/O signals. One or more of the integrated devices of FIGS. 6-11 may be examples of an integrated device that is wafer level package (WLP).

Exemplary Sequence for Fabricating an Integrated Device Comprising Interconnect Structure Having an Inner Interconnect, a Dielectric Layer and an Outer Conductive Layer In some implementations, fabricating an integrated device that includes interconnect structures includes several processes. FIG. 12 (which includes FIGS. 12A-12F) illustrates an exemplary sequence for providing or fabricating an integrated device that includes interconnect structures. In some implementations, the sequence of FIGS. 12A-12F may be used to provide or fabricate the integrated device 600 of FIG. 6 and/or other integrated devices described in the present disclosure.

It should be noted that the sequence of FIGS. 12A-12F may combine one or more stages in order to simplify and/or clarify the sequence for providing or fabricating an integrated device that includes interconnect structures. In some implementations, the order of the processes may be changed or modified. In some implementations, one or more of processes may be replaced or substituted without departing from the spirit of the disclosure.

Figure 12A:
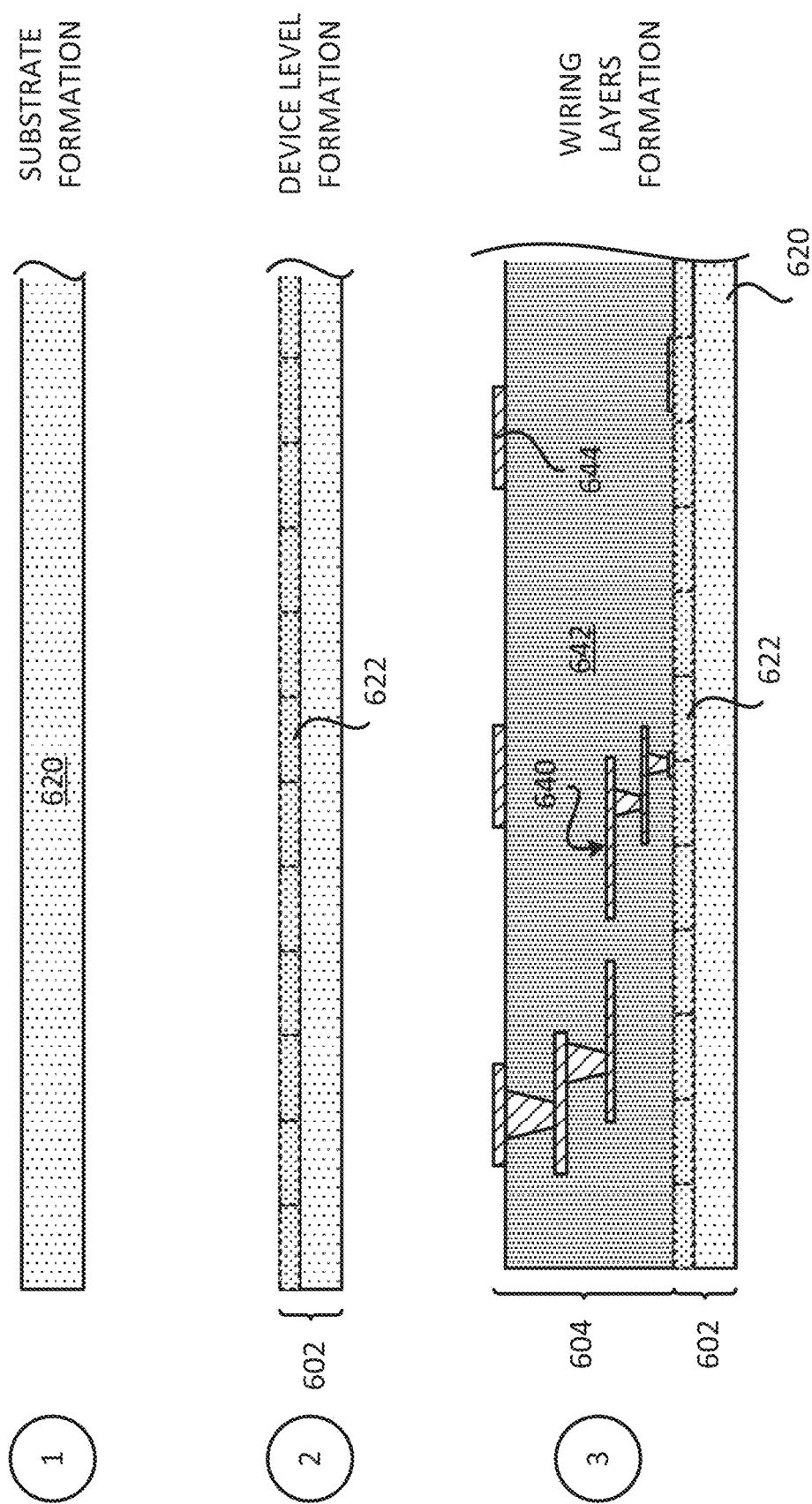
FIG. 12 (comprising FIGS. 12A-12F) illustrates an exemplary sequence for fabricating an integrated device that includes an interconnect structure having an inner interconnect, a dielectric layer and a conductive layer.

Stage 1, as shown in FIG. 12A, illustrates a state after substrate formation, where a substrate 620 is provided or formed. Different implementations may provide different materials for the substrate 620. In some implementations, the substrate 620 may include silicon.

Stage 2 illustrates a state after device level formation, where the device level layer is formed over the substrate 620. The device level layer may include the plurality of device level cells 622. Thus, Stage 2 may illustrate a state after the plurality of device level cells 22 is formed over the substrate 620. In some implementations, a front end of line (FEOL) process may be used to fabricate the device level layer (e.g., plurality of device level cells 622). The plurality of device level cells may include logical cells and/or transistors for a circuit. Stage 2 may illustrate the substrate portion 602.

Stage 3 illustrates a state after wiring layers formation, where the interconnect portion 604 is formed. The interconnect portion 604 may include the plurality of interconnects 640 (and pad 644) and at least one dielectric layer 642. In some implementations, a back end of line (BEOL) process may be used to fabricate the interconnect portion 604.

Figure 12B:
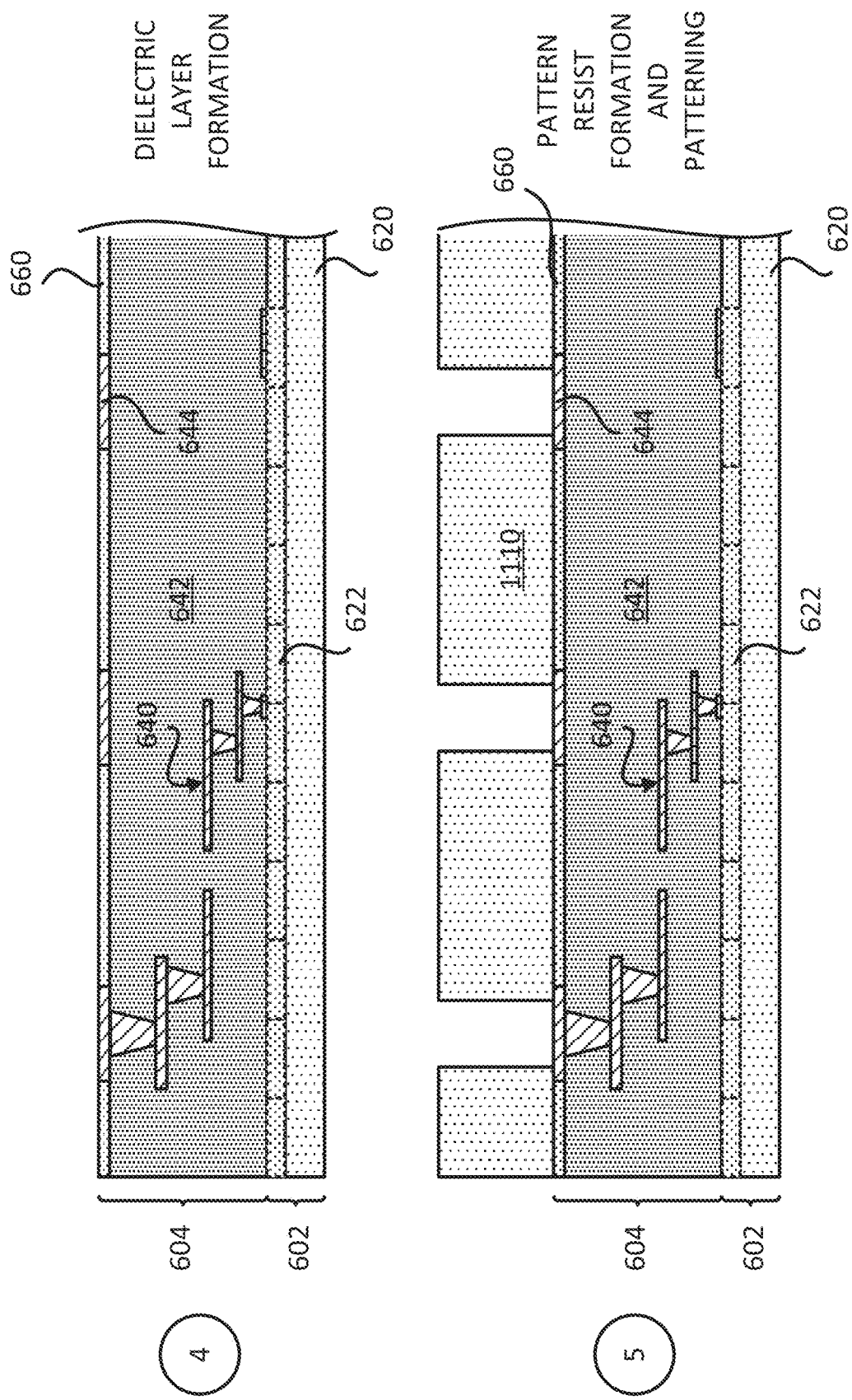

Stage 4, as shown in FIG. 12B, illustrates a state after dielectric layer formation, where a dielectric layer 660 is formed over the interconnect portion 604. A lamination process may be used to form the dielectric layer 660, The dielectric layer 660 may be a passivation layer.

Stage 5 illustrates a state after pattern resist formation and patterning formation, where a pattern resist layer 1110 is formed and etched over the dielectric layer 660.

Figure 12C:
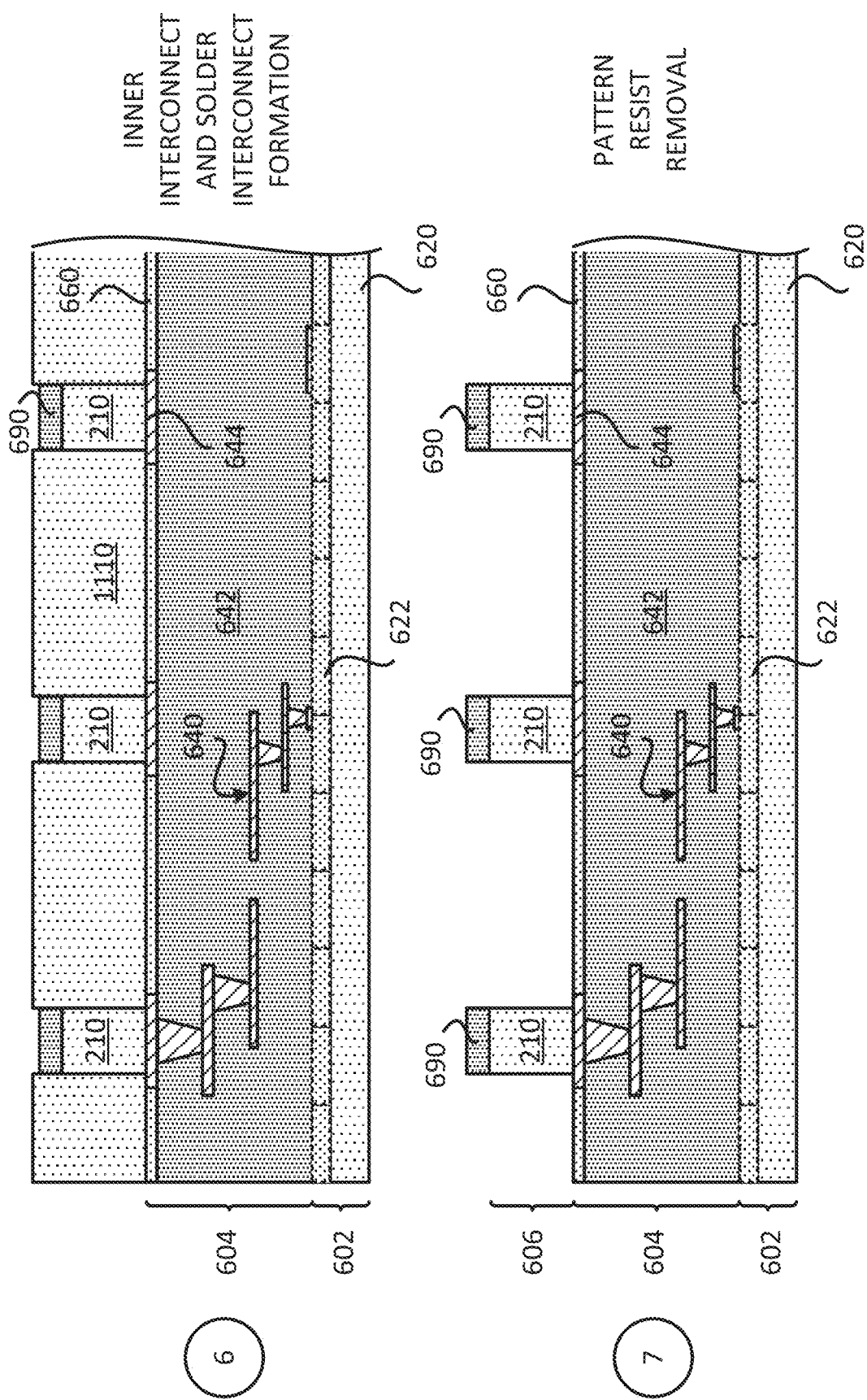

Stage 6, as shown in FIG. 12C, illustrates a state after inner interconnect and solder interconnect formation, where the inner interconnect 210 and the solder interconnect 690 are provided. In some implementations, the inner interconnect 210 may be formed using a plating process (e.g., electro plating). The solder interconnect 690 may be provided through a pasting process. Different implementations may provide the inner interconnect 210 and/or the solder interconnect 690 differently.

Stage 7 illustrates a state after pattern resist removal, where the pattern resist layer 1110 is removed, leaving the inner interconnect 210 coupled to a pad (e.g., 644).

Figure 12D:
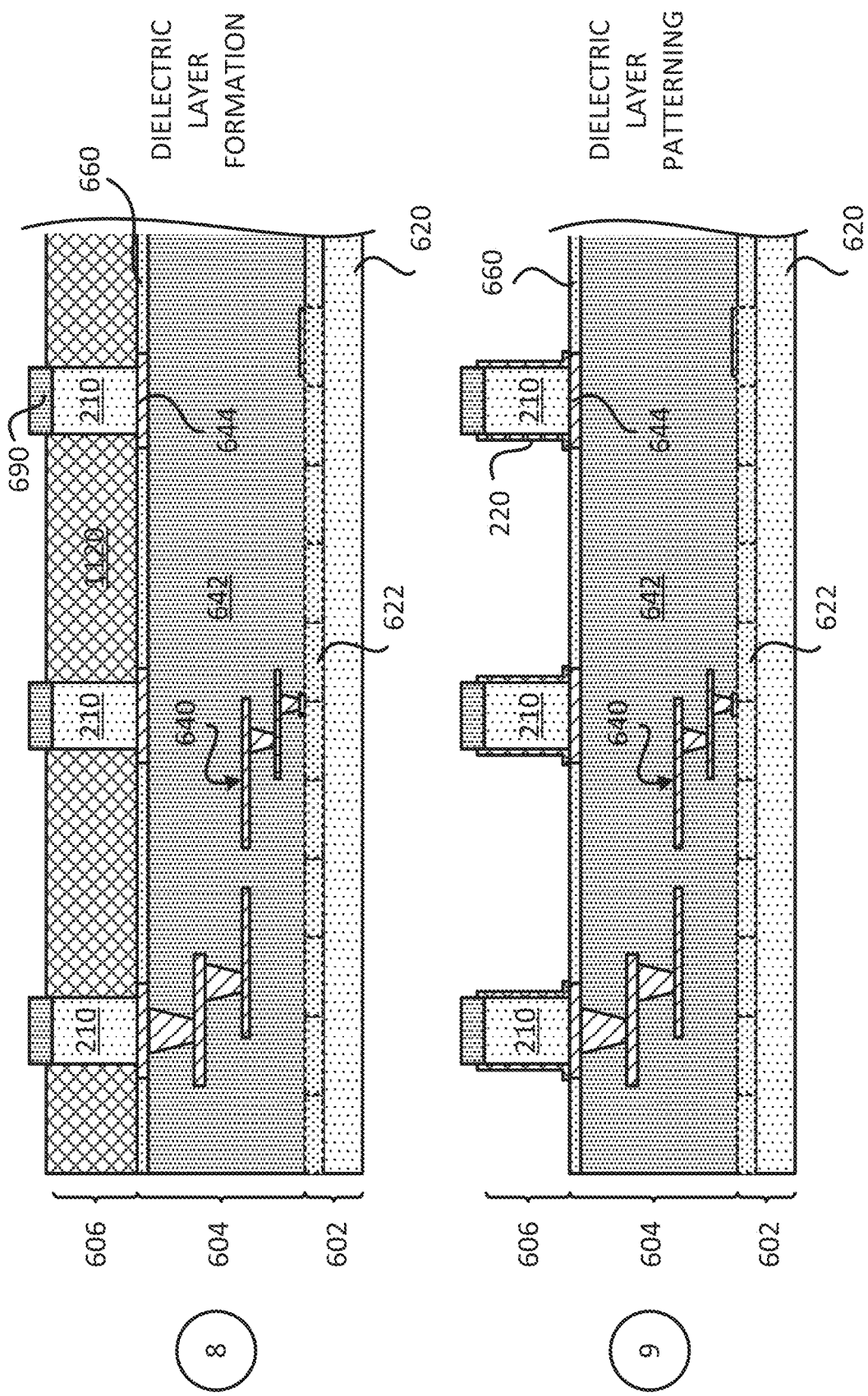

Stage 8, as shown in FIG. 12D, illustrates a state after dielectric layer formation, where a dielectric layer 1120 is formed. A lamination process may be used to form the dielectric layer 1120. The dielectric layer 1120 may include a photo-etchable or photo-sensitive dielectric layer.

Stage 9 illustrates a state after dielectric layer patterning, where the dielectric layer 1120 is patterned to form the dielectric layer 220 that laterally surrounds the inner interconnect 210. An etching process (e.g., photo etching process) may be used to pattern the dielectric layer 1120 to form the dielectric layer 220 around the inner interconnect 210.

Figure 12E:
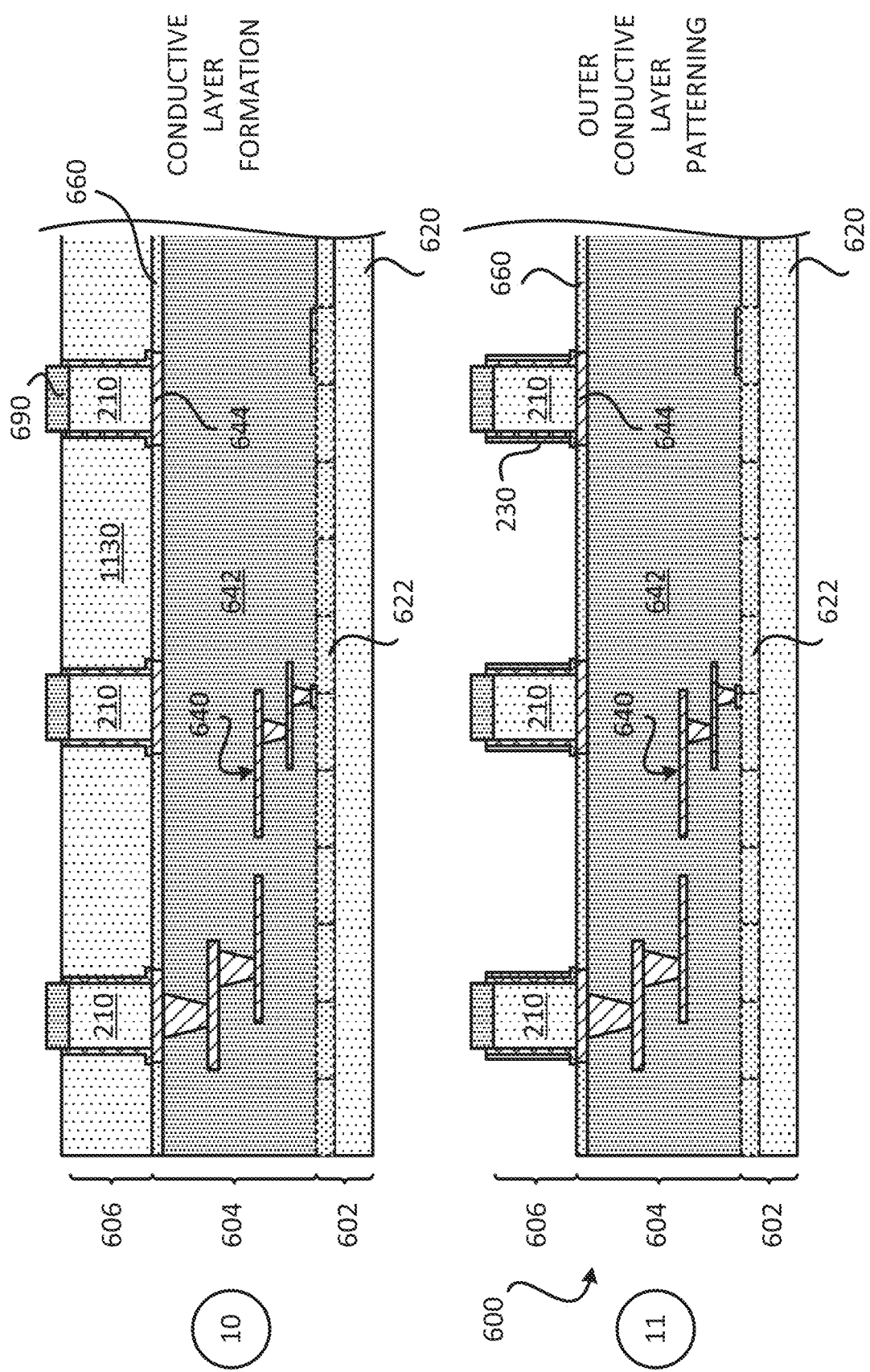

Stage 10, as shown in FIG. 12E, illustrates a state after conductive layer formation, where a conductive layer 1130 (e.g., metal) is disposed over the dielectric layer 660 and around the dielectric layer 220. The conductive layer 1130 may be a photo-sensitive or photo-etchable layer. The conductive layer 1130 may include an electrically conductive layer and/or electrically conductive material.

Stage 11 illustrates a state after outer conductive layer patterning and formation, where the conductive layer 1130 has been etched to form the outer conductive layer 230 around the dielectric layer 220 and the inner interconnect 210. In some implementations, an etching process (e.g., photo etching process) may be used to pattern the conductive layer 1130 into the outer conductive layer 230.

Figure 12F:
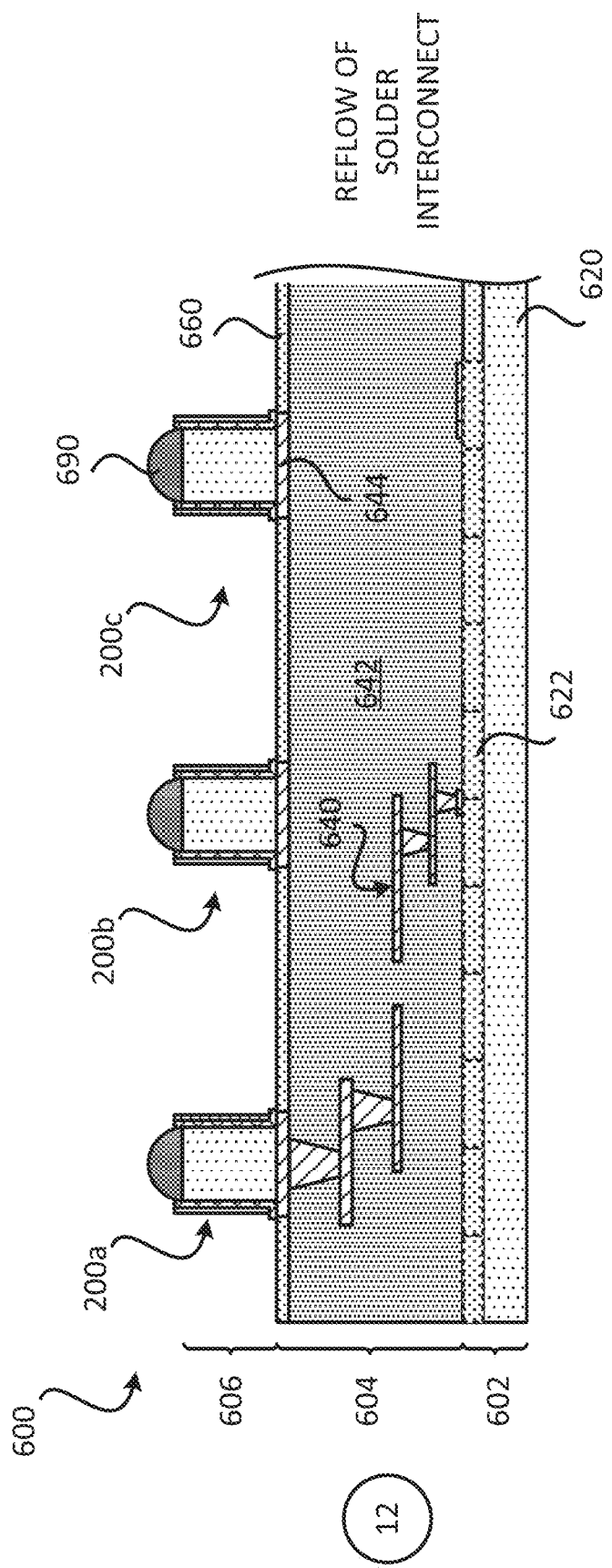

Stage 12, as shown in FIG. 12F, illustrates a state after reflow, where a reflow process is used on the solder interconnect 690 to couple the solder interconnect 690 to an interconnect. The solder interconnect 690 may be coupled to a pad (e.g., pad of substrate, pad of a PCB). It is noted that Stages 11 and 12 may illustrate the integrated device 600 of FIG. 6.

Exemplary Sequence for Fabricating an Integrated Device Comprising Interconnect Structure Having an Inner Interconnect, a Dielectric Layer and an Outer Conductive Layer In some implementations, fabricating an integrated device that includes interconnect structures includes several processes. FIG. 13 (which includes FIGS. 13A-13E) illustrates an exemplary sequence for providing or fabricating an integrated device that includes interconnect structures. In some implementations, the sequence of FIGS. 13A-13E may be used to provide or fabricate the integrated device 1100 of FIG. 11 and/or other integrated devices described in the present disclosure.

It should be noted that the sequence of FIGS. 13A-13E may combine one or more stages in order to simplify and/or clarify the sequence for providing or fabricating an integrated device that includes interconnect structures. In some implementations, the order of the processes may be changed or modified. In some implementations, one or more of processes may be replaced or substituted without departing from the spirit of the disclosure.

Figure 13A:
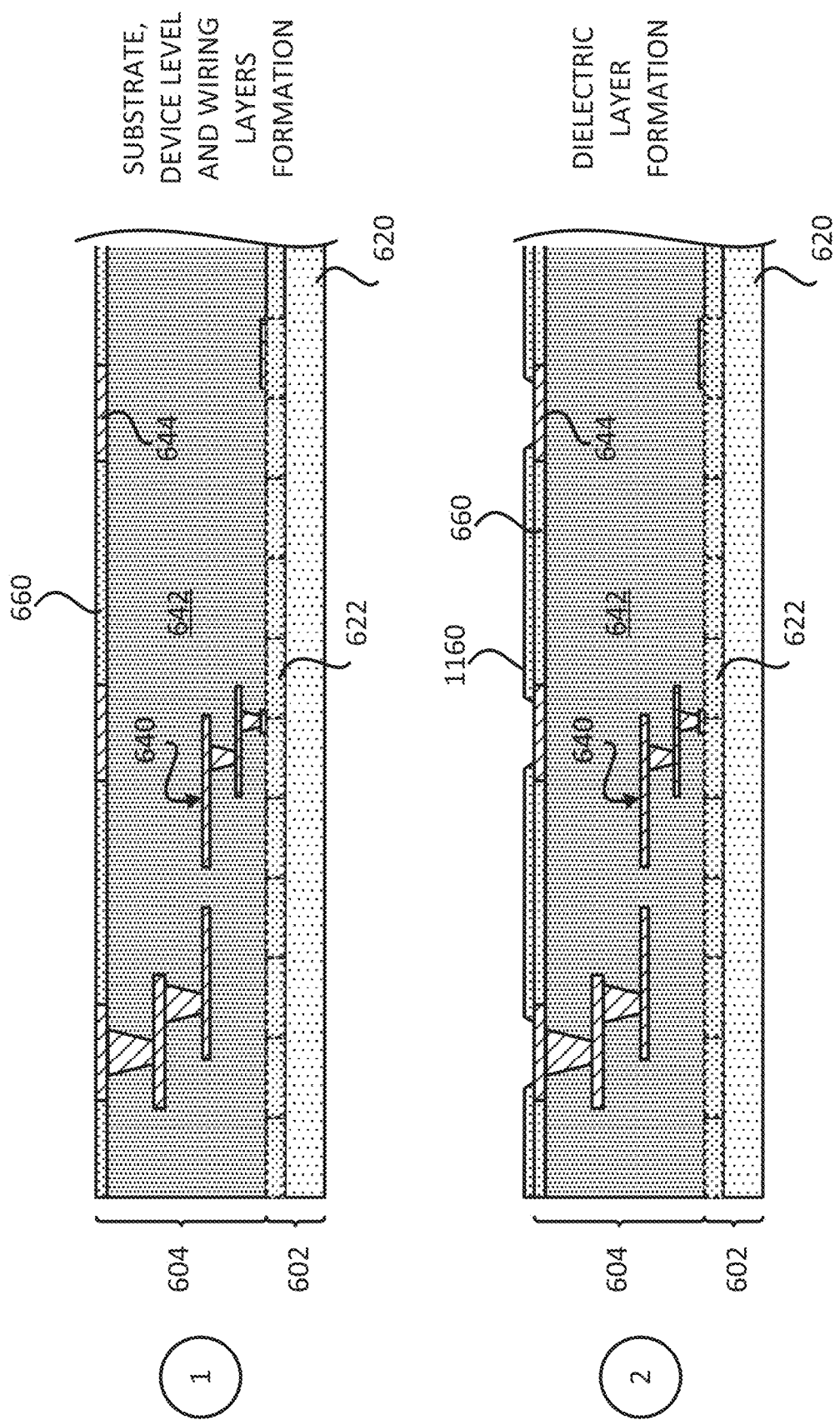
FIG. 13 (comprising FIGS. 13A-13E) illustrates an exemplary sequence for fabricating an integrated device that includes an interconnect structure having an inner interconnect, a dielectric layer and a conductive layer.

Stage 1, as shown in FIG. 13A, illustrates a state after substrate, device level, and wiring layers formation. Stage 1 also illustrates a state after the dielectric layer 660 has been formed. In some implementations, Stage 1 of FIG. 13A may be similar and represent Stages 1-4 of FIGS. 12A-12B, which was described above.

Stage 2 illustrates a state after dielectric layer formation, where a dielectric layer 1160 is formed over the dielectric layer 660. A lamination process may be used to form the dielectric layer 1160. The dielectric layer 1160 may be a passivation layer.

Figure 13B:
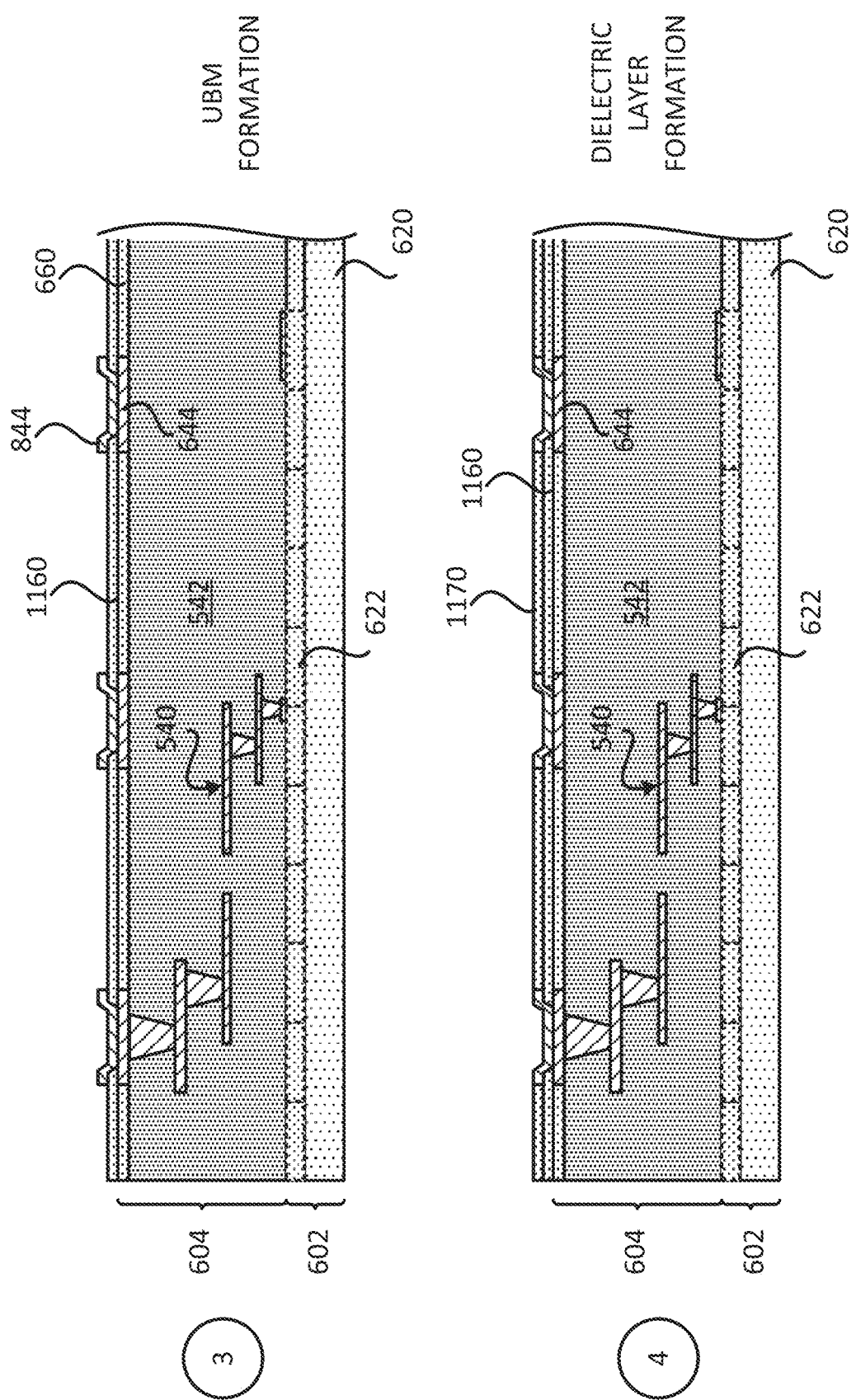

Stage 3, as shown in FIG. 13B, illustrates a state after under bump metallization (UBM) formation, where the UBM 844 is formed over the pad 644. A plating process may be used to form the UBM 844. However, different implementations may form the UBM 844 differently.

Stage 4 illustrates a state after dielectric layer formation, where a dielectric layer 1170 is formed over the dielectric layer 1160. A lamination process may be used to form the dielectric layer 1170. The dielectric layer 1170 may be a passivation layer.

Figure 13C:
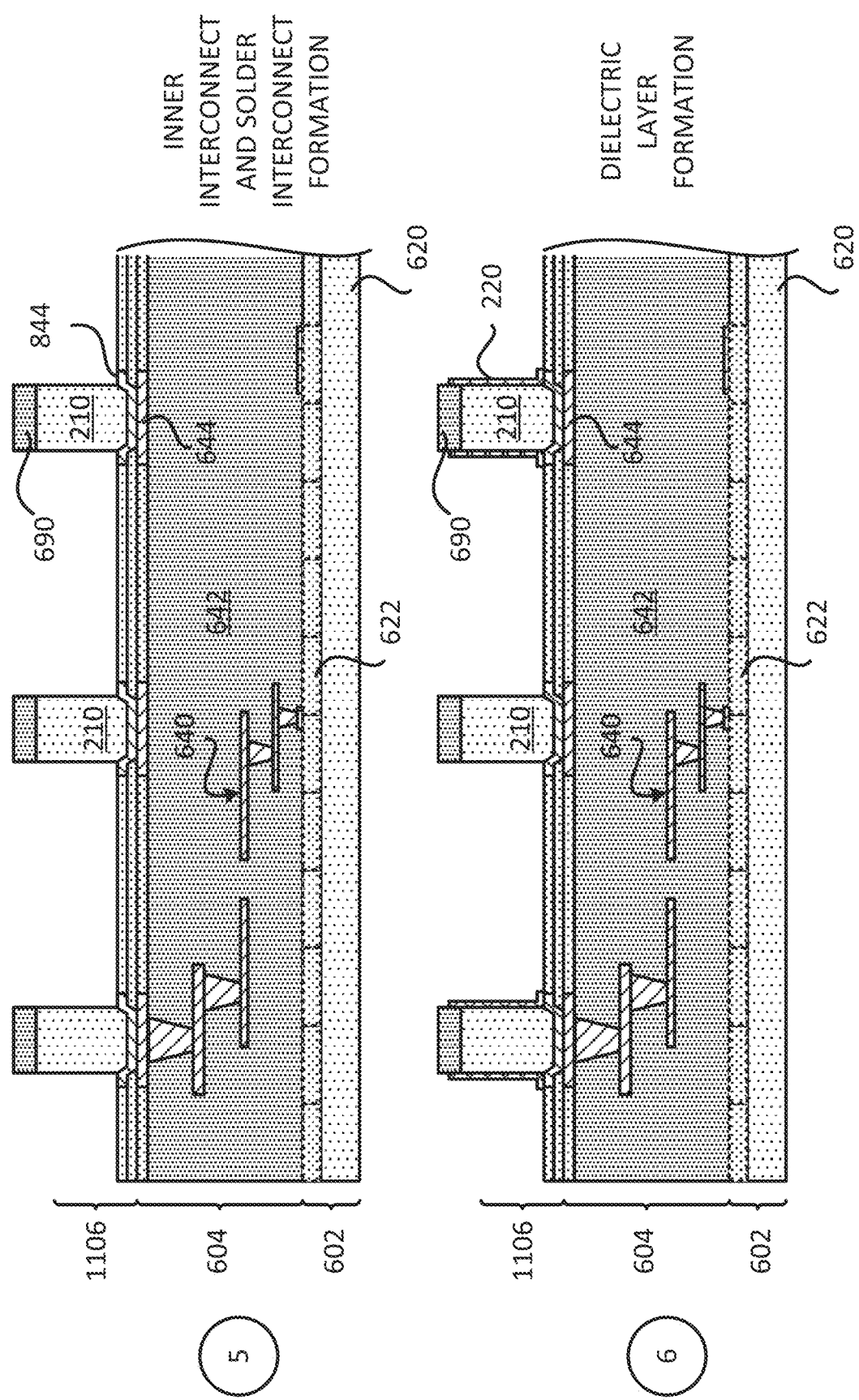

Stage 5, as shown in FIG. 13C, illustrates a state after inner interconnect and solder interconnect formation, where the inner interconnect 210 and the solder interconnect 690 are provided. In some implementations, a pattern resist layer is formed and etched over the dielectric layer, and the inner interconnect and solder interconnect are formed. In some implementations, the inner interconnect 210 may be formed using a plating process (e.g., electro plating). The solder interconnect 690 may be provided through a pasting process. Different implementations may provide the inner interconnect 210 and/or the solder interconnect 690 differently. After the inner interconnect 210 and the solder interconnect 690 are provided, the pattern resist layer may be removed, leaving the inner interconnect 210 coupled to a UBM (e.g., 844). Stages 5-7 of FIGS. 12B-12C illustrate and describe an example of forming an inner interconnect and providing a solder interconnect.

Stage 6 illustrates a state after dielectric layer formation, where the dielectric layer 220 is formed around the inner interconnect 210. In some implementations, dielectric layer formation may include forming a dielectric layer 1120 and patterning the dielectric layer to form the dielectric layer 220. A lamination process may be used to form the dielectric layer 1120. The dielectric layer 1120 may include a photo-etchable or photo-sensitive dielectric layer. Stages 8-9 of FIG. 12D illustrate and describe an example of forming a dielectric layer around an inner interconnect.

Figure 13D:
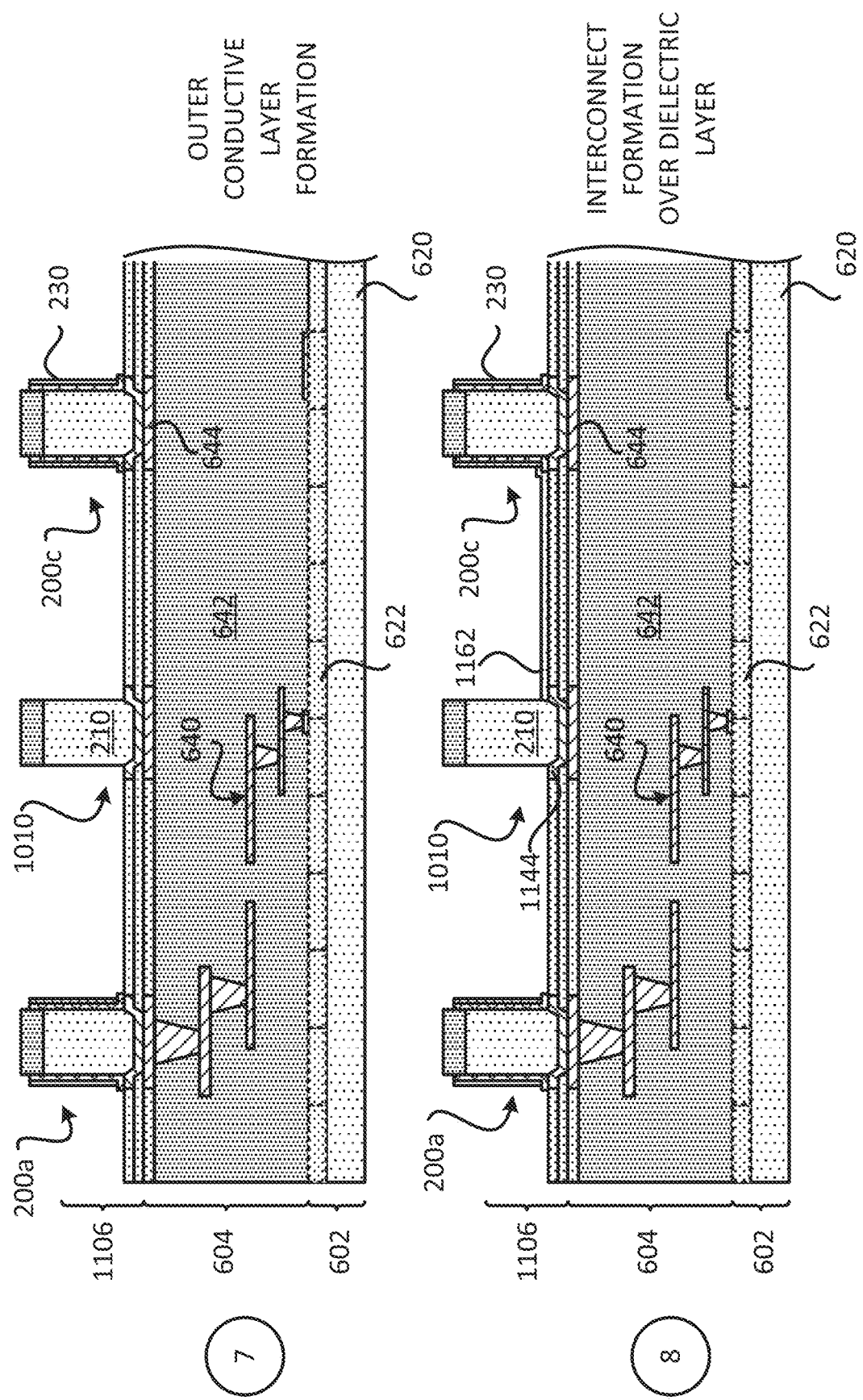

Stage 7, as shown in FIG. 13D, illustrates a state after outer conductive layer formation, where a conductive layer (e.g., 1130) is formed and then patterned to form the outer conductive layer 230 for the interconnect structure 200 (e.g., 200a, 200c). Stage 7 illustrates the pillar interconnect 1010 is not surrounded by the dielectric layer 220 or the outer conductive layer 230. The pillar interconnect 1010 may be configured to provide an electrical path for ground. An outer conductive layer formation may include disposing a conductive layer (e.g., 1130) over the dielectric layer (e.g., 660, 1160, 1170) and around the dielectric layer 220. The conductive layer 1130 may be a photo-sensitive or photo-etchable layer. The conductive layer 1130 may be patterned to form the outer conductive layer 230. In some implementations, an etching process (e.g., photo etching process) may be used to pattern the conductive layer 1130 into the outer conductive layer 230. Stages 10-11 of FIG. 12D illustrate and describe an example of forming an outer conductive layer.

Stage 8 illustrates a state after interconnect formation over the dielectric layer, where an interconnect 1162 (e.g., packaging interconnect) is formed such that the interconnect 1162 is coupled to the outer conductive layer 230 of the interconnect structure 200c and the inner interconnect 210 of the pillar interconnect 1010. The interconnect 1162 may be formed such that the interconnect 1162 is coupled to the UBM 1144. The pillar interconnect 1010 is configured to be coupled to ground. As such, the outer conductive layer 230 of the interconnect structure 200c may also be configured to be coupled to ground. A plating process may be used to form the interconnect 1162.

Figure 13E:
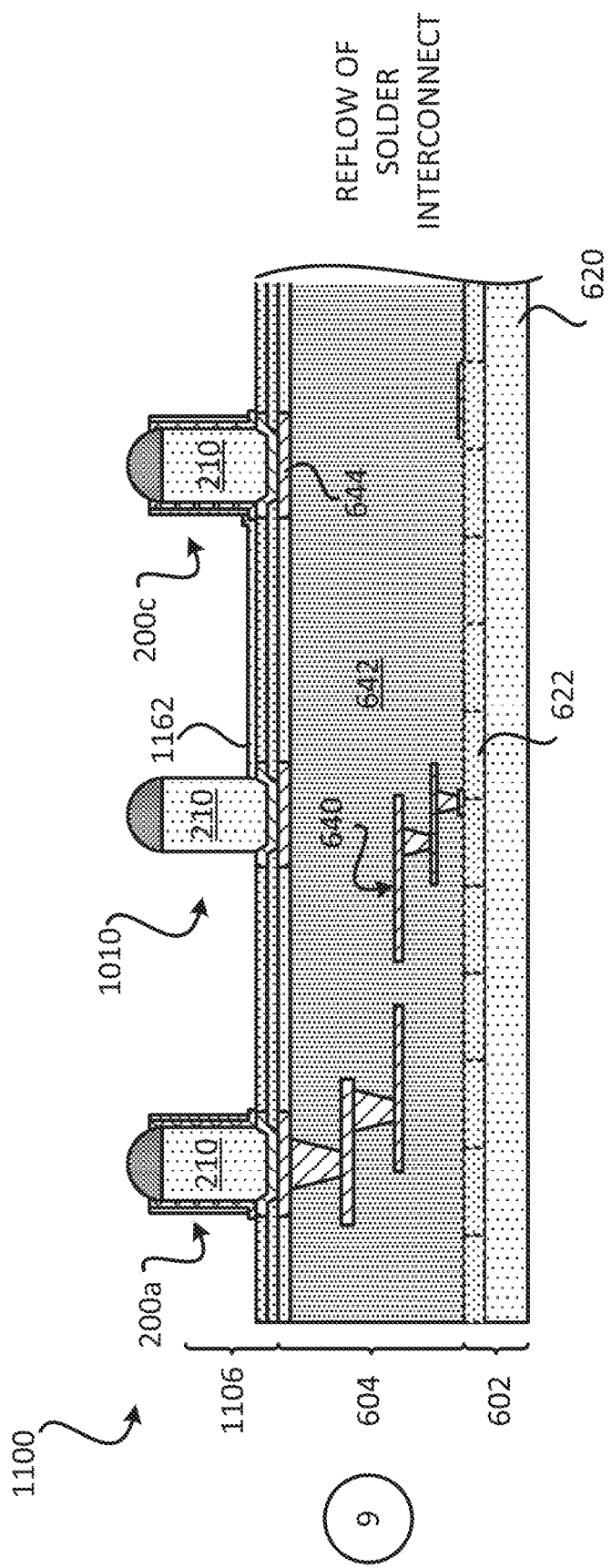

Stage 9, as shown in FIG. 13E, illustrates a state after reflow, where a reflow process is used on the solder interconnect 690 to couple the solder interconnect 690 to an interconnect. The solder interconnect 690 may be coupled to a pad (e.g., pad of substrate, pad of a PCB). It is noted that Stages 8 and 9 may illustrate the integrated device 1100 of FIG. 11.

Figure 14:
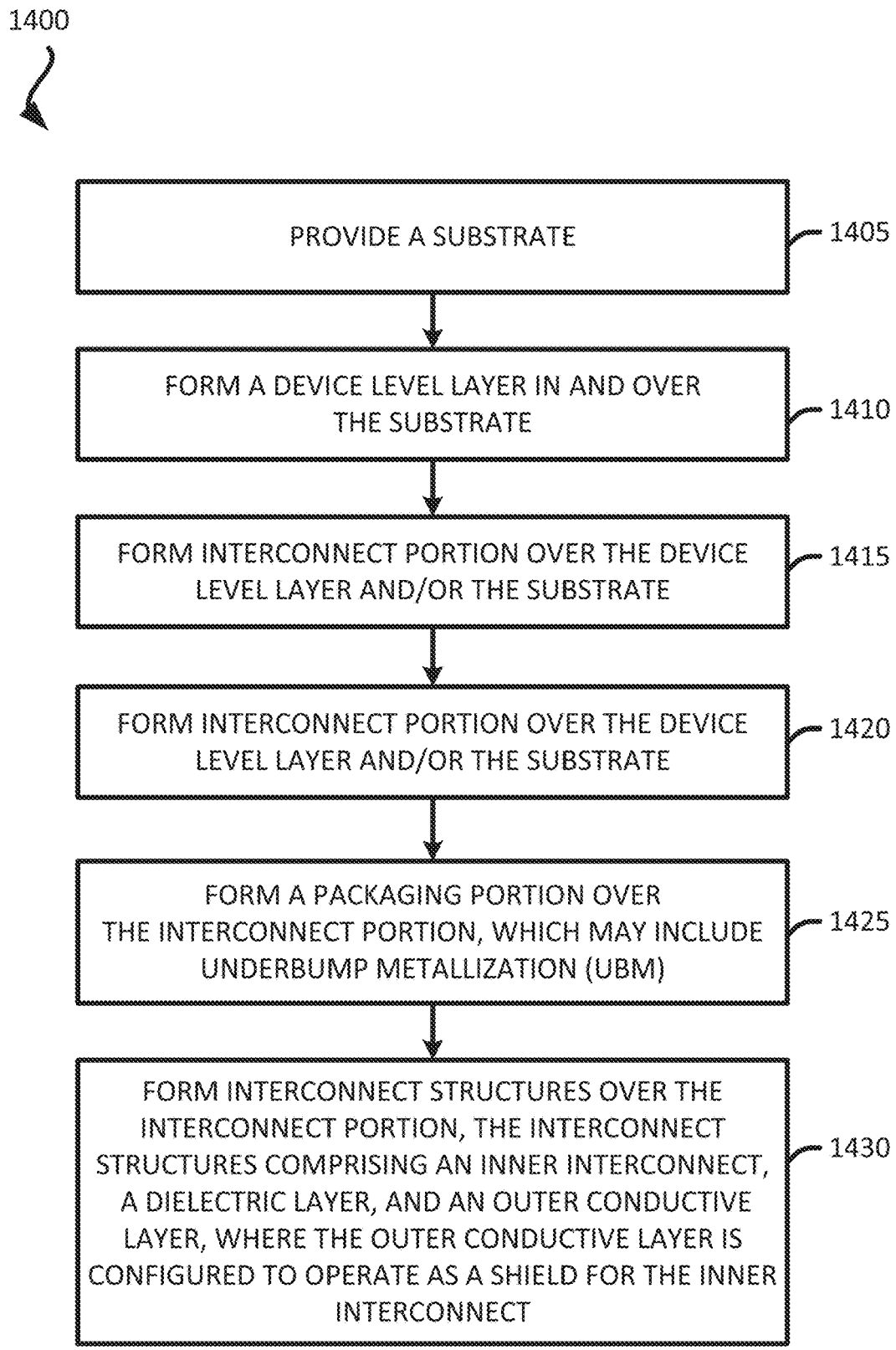
FIG. 14 illustrates an exemplary flow diagram of a method for fabricating an integrated device that includes an interconnect structure having an inner interconnect, a dielectric layer and a conductive layer.

Exemplary Flow Diagram of a Method for Fabricating an Integrated Device Comprising Interconnect Structure Having an Inner Interconnect, a Dielectric Layer and an Outer Conductive Layer In some implementations, fabricating an integrated device that includes interconnect structures having an inner interconnect, a dielectric layer and an outer conductive layer includes several processes. FIG. 14 illustrates an exemplary flow diagram of a method 1400 for providing or fabricating an integrated device that includes an inner interconnect, a dielectric layer and an outer conductive layer. In some implementations, the method 1400 of FIG. 14 may be used to provide or fabricate the integrated device of FIG. 6 described in the disclosure. However, the method 1400 may be used to provide or fabricate any of the integrated devices and/or packages described in the disclosure.

It should be noted that the sequence of FIG. 14 may combine one or more processes in order to simplify and/or clarify the method for providing or fabricating an integrated device that includes an inner interconnect, a dielectric layer and an outer conductive layer. In some implementations, the order of the processes may be changed or modified.

The method provides (at 1405) a substrate, such as the substrate 620. The substrate may include silicon. However, the substrate may include different materials.

The method forms (at 1410) a device level layer over the substrate (e.g., 620). Forming the device level layer may include forming a plurality of device level cells 622. The plurality of device level cells may include logical cells and/or transistors that are part of a circuit. In some implementations, a front end of line (FEOL) process may be used to fabricate the device level layer.

The method forms (at 1420) an interconnect portion (e.g., 604) over the device level layer and/or the substrate. Forming the interconnect portion may include forming a plurality of interconnects 640 (and pad 644) and at least one dielectric layer 642. In some implementations, a back end of line (BEOL) process may be used to fabricate the interconnect portion 604. The method may also form (at 1420) a dielectric layer (e.g., 660) over the interconnect portion 604. Stages 3-4 of FIGS. 12A-12B illustrate an example of interconnect portion formation.

The method forms (at 1425) a packaging portion (e.g., 606, 806, 906, 1006, 1106) over the interconnect portion. Forming the packaging portion may include forming dielectric layer(s) (e.g., 1160, 1170), UBMs (e.g., 844, 944), and interconnects (e.g., 1010, 1062, 1162). A lamination and plating process may be used to form the packaging portion. However, different implementations may form the packaging portion differently. Stages 2-4 of FIGS. 13A-13B illustrate an example of packaging portion formation.

The method forms (at 1430) interconnect structures (e.g., 200a-200h) over the interconnect portion or the packaging portion. The interconnect structures (e.g., 200a-200h) may be considered part of the packaging portion and thus may be formed when the packaging portion is formed. The interconnect structures may include an inner interconnect 210, a dielectric layer 220, and an outer conductive layer 230. The outer conductive layer 230 may include an electrically conductive layer. The outer conductive layer 230 is configured to not be in electrical contact with the inner interconnect 210. The outer conductive layer 230 may be configured to operate as a shield (e.g., EMI shield) for the inner interconnect 210, thereby providing improved isolation of signals traveling through the inner interconnect 210. The outer conductive layer 230 may be configured to be coupled to ground. A solder interconnect (e.g., 690) may be coupled to the inner interconnect 210. Stages 5-8 of FIGS. 13C-13D illustrate an example of interconnect structure formation.

Figure 15:
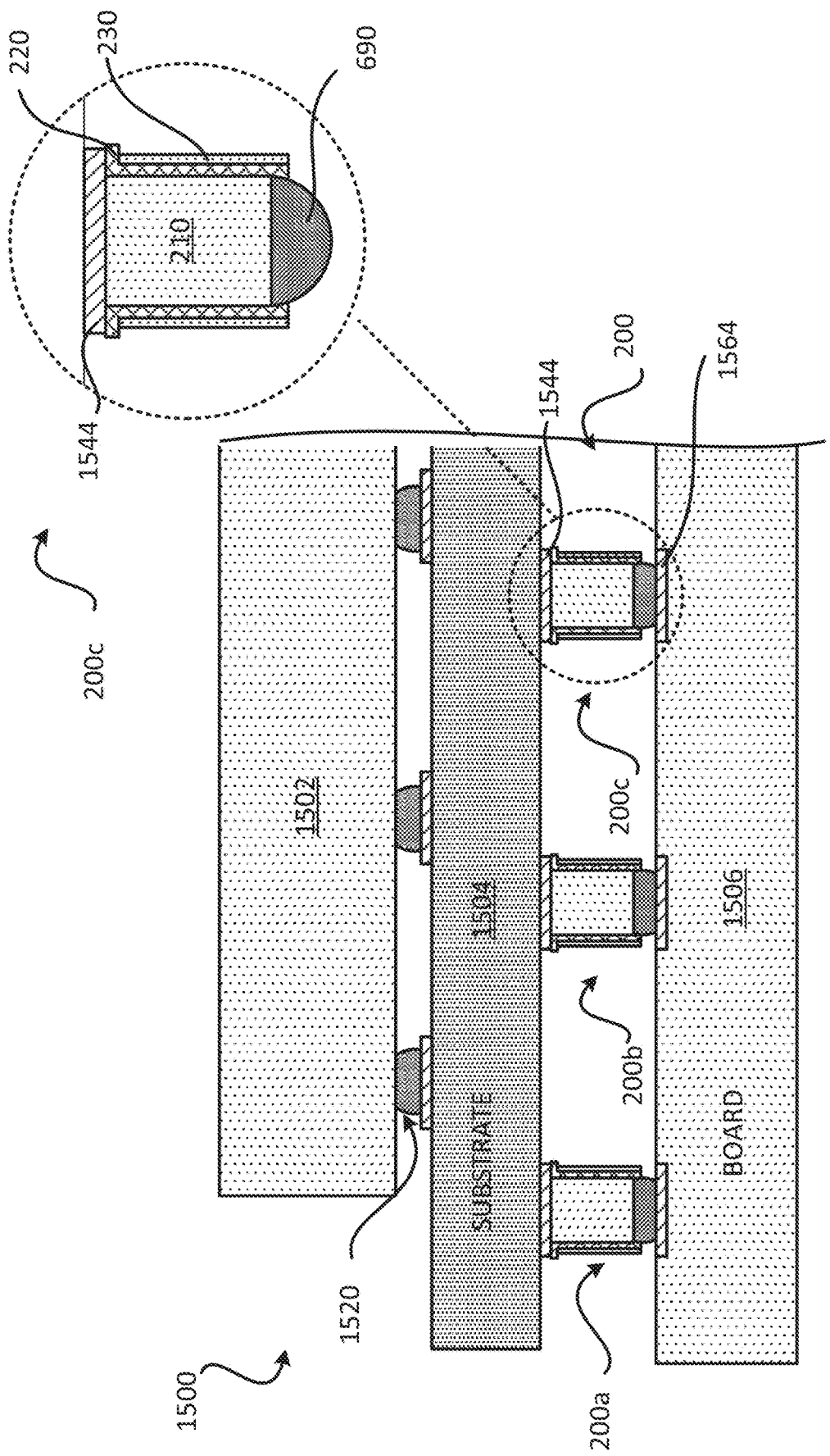
FIG. 15 illustrates a profile view of an exemplary package that includes an interconnect structure having an inner interconnect, a dielectric layer and a conductive layer.

Exemplary Package Comprising Interconnect Structure Having an Inner Interconnect, a Dielectric Layer and an Outer Conductive Layer FIG. 15 illustrates a package 1500 that include an interconnect structure having an inner interconnect 210, a dielectric layer 220, and an outer conductive layer 230. The package 1500 (e.g., integrated device package) includes an integrated device 1502 (e.g., die) and a substrate 1504 (e.g., package substrate). The integrated device 1502 is coupled to the substrate 1504 through the plurality of solder interconnect 1520. The package 1500 also includes a plurality of interconnect structures 200 (e.g., 200a-200c), where each interconnect structure includes the inner interconnect 210, the dielectric layer 220, and the outer conductive layer 230. The plurality of interconnect structures 200 is coupled to the substrate 1504 and to the board 1506 (e.g., PCB). For example, the interconnect structure 200c is coupled to an interconnect 1544 (e.g., pad) of the substrate 1504 and the interconnect 1564 of the board 1506. The use of interconnect structures 200a-200c reduces the amount of cross talk there may be between signals traveling through interconnects due to the outer conductive layer 230 that shields and isolates the signals traveling through the inner interconnect 210. The outer conductive layer 230 may be configured to provide EMI shielding for signals that travel through the inner interconnect 210.

Figure 16:
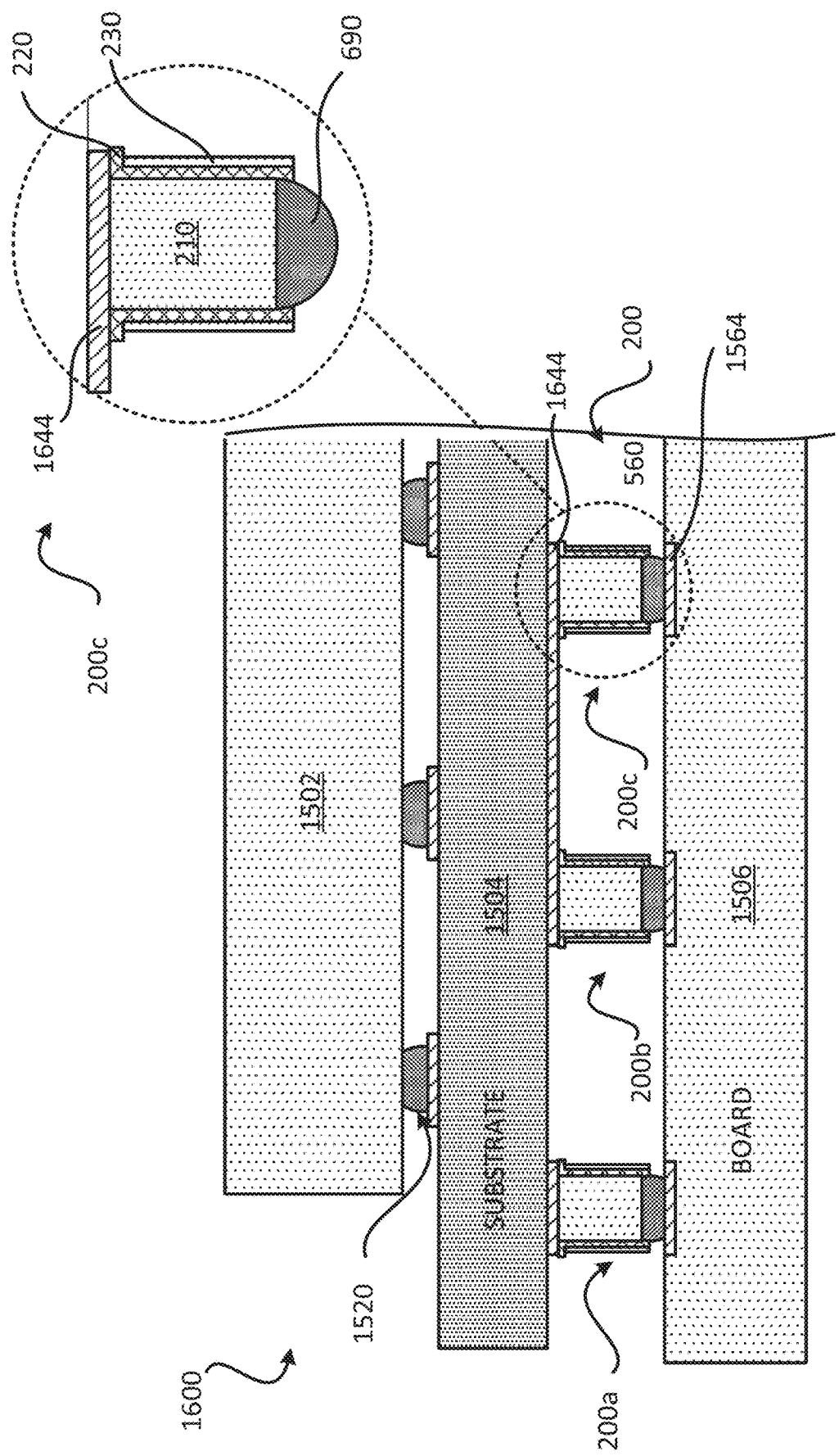
FIG. 16 illustrates a profile view of an exemplary package that includes an interconnect structure having an inner interconnect, a dielectric layer and a conductive layer.

FIG. 16 illustrates another package 1600 that includes an interconnect structure having an inner interconnect 210, a dielectric layer 220, and an outer conductive layer 230. The package 1600 (e.g., integrated device package) is similar to the package 1500 of FIG. 15. The package 1600 include similar components as the package 1500. The package 1600 includes a substrate 1504 (e.g., package substrate). The substrate 1504 includes an interconnect 1644 that is coupled to the interconnect structure 200b and the interconnect structure 200c.

Figure 17:
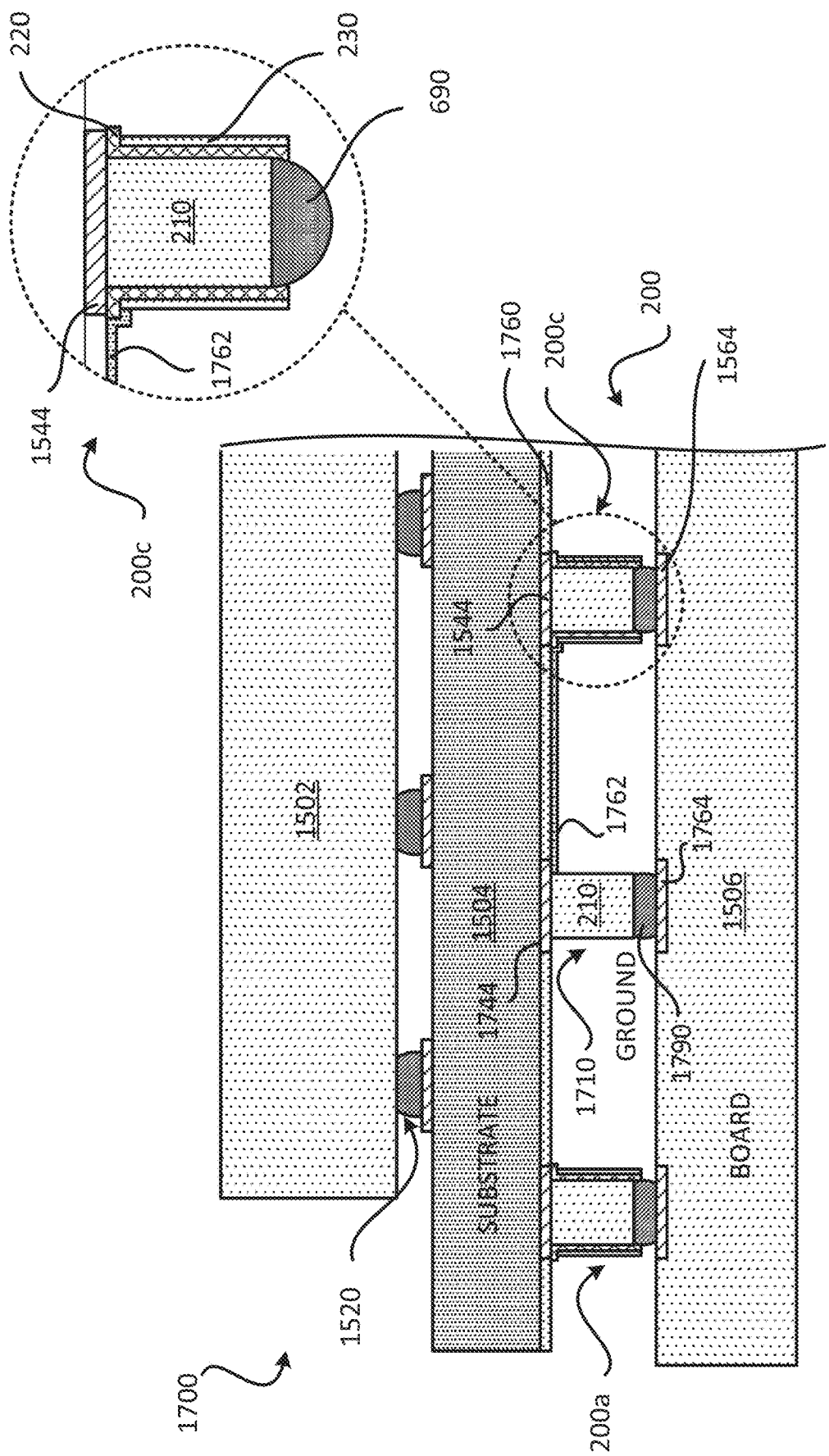
FIG. 17 illustrates a profile view of an exemplary package that includes an interconnect structure having an inner interconnect, a dielectric layer and a conductive layer.

FIG. 17 illustrates another package 1700 that includes an interconnect structure having an inner interconnect 210, a dielectric layer 220, and an outer conductive layer 230. The package 1700 is similar to the package 1500 of FIG. 15. The package 1700 include similar components as the package 1500. The package 1700 (e.g., integrated device package) includes a substrate 1504 (e.g., package substrate). The substrate 1504 includes a dielectric layer 1760, an interconnect 1744, an interconnect 1762 (e.g., substrate interconnect) and an interconnect 1544. The dielectric layer 1760 may be a solder resist layer. The package 1700 also includes a pillar interconnect 1710 and the interconnect structures 200a and 200c. The pillar interconnect 1710 includes the inner interconnect 210 and the solder interconnect 1790. The pillar interconnect 1710 may include a copper pillar. The board 1506 (e.g., PCB) includes an interconnect 1564 and an interconnect 1764.

As shown in FIG. 17, the interconnect structure 200c is coupled to the interconnect 1544 of the substrate 1504, and to the interconnect 1564 of the board 1506. Similarly, the pillar interconnect 1710 is coupled to the interconnect 1744 of the substrate 1504, and to the interconnect 1764 of the board 1506. The pillar interconnect 1710 is configured to provide an electrical path for ground. The interconnect 1762 (e.g., substrate interconnect) is located over the dielectric layer 1760. The interconnect 1762 is coupled to the interconnect 1764 and/or the inner interconnect 210 of the pillar interconnect 1710. The interconnect 1762 is also coupled to the outer conductive layer 230 of the interconnect structure 200c. Thus, the outer conductive layer 230 of the interconnect structure 200c is indirectly coupled to the inner interconnect 210 of the pillar interconnect 1710. Since the pillar interconnect 1710 is configured to provide an electrical path for ground (e.g., configured to be coupled to ground), the outer conductive layer 230 of the interconnect structure 200c is also configured to provide an electrical path for ground (e.g., configured to be coupled to ground). When the outer conductive layer 230 of the interconnect structure 200c is configured to be coupled to ground, it helps provide better isolation for signals traveling through the inner interconnect 210 of the interconnect structure 200c.

It is noted that the packages of FIGS. 15-17 may include other interconnect structures and/or pillar interconnects that may be configured to provide electrical paths for ground, power and/or I/O signals. For example, there may be interconnect structures (e.g., 200) between the integrated device 1502 and the substrate 1504.

Exemplary Electronic Devices

Figure 18:
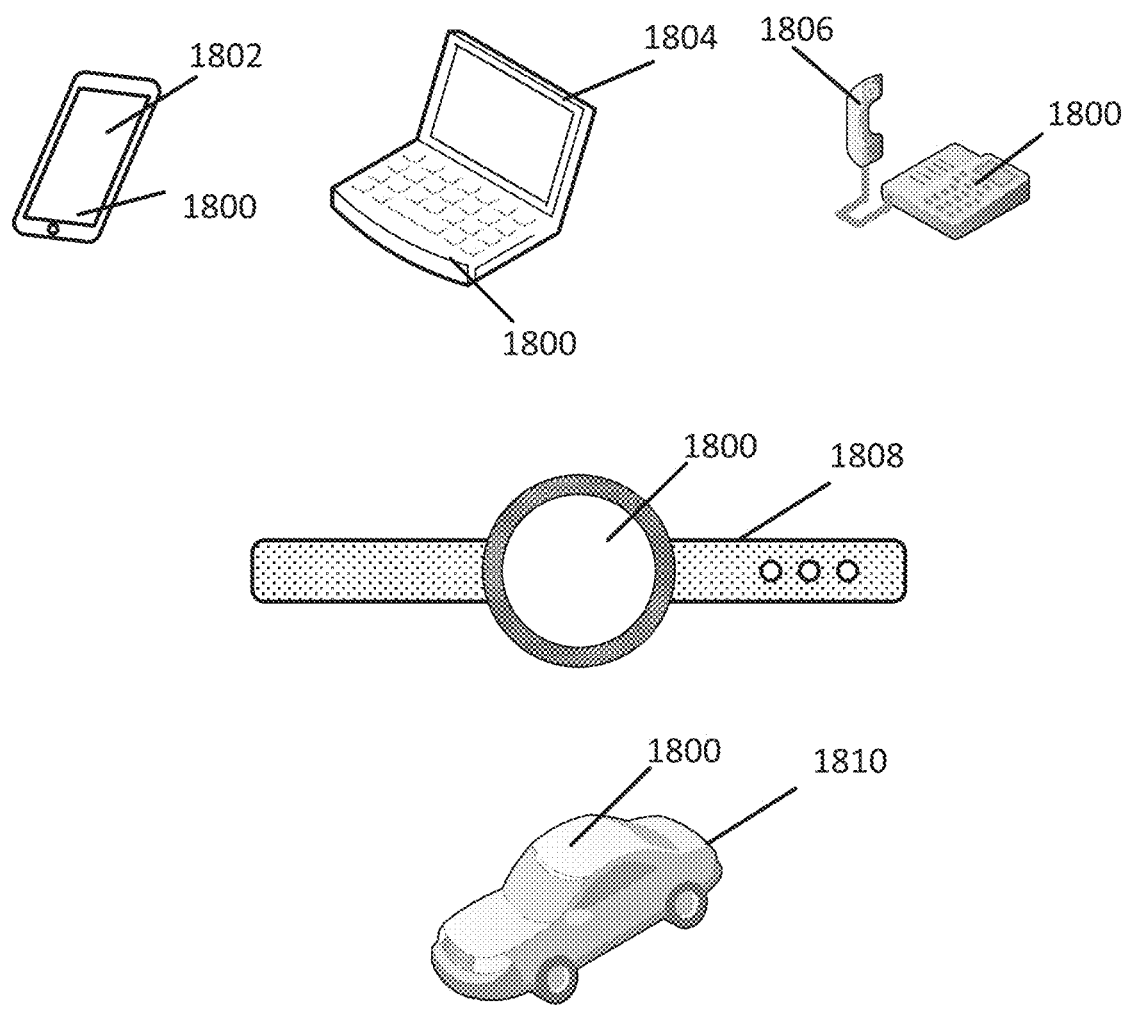
FIG. 18 illustrates various electronic devices that may integrate a die, an integrated device, an integrated passive device (IPD), a passive component, a package, and/or a device package described herein.

FIG. 18 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1802, a laptop computer device 1804, a fixed location terminal device 1806, a wearable device 18018, or automotive vehicle 1810 may include a device 1800 as described herein. The device 1800 may be, for example, any of the devices and/or integrated circuit (IC) packages described herein. The devices 1802, 1804, 1806 and 18018 and the vehicle 1810 illustrated in FIG. 18 are merely exemplary. Other electronic devices may also feature the device 1800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-11, 12A-12F, 13A-13E and/or 14-18 may be rearranged and/or combined into a single component, process, feature or function or embodied in several components, processes, or functions. Additional elements, components, processes, and/or functions may also be added without departing from the disclosure. It should also be noted FIGS. 2-11, 12A-12F, 13A-13E and/or 14-18 and its corresponding description in the present disclosure is not limited to dies and/or ICs. In some implementations, FIGS. 2-11, 12A-12F, 13A-13E and/or 14-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the positions, the locations, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect includes an electrically conductive material that may be configured to provide an electrical path for a signal (e.g., a data signal) ground or power. An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
a substrate comprising a plurality of transistors and/or logical cells;
an interconnect portion coupled to the substrate, the interconnect portion located over the substrate and over the plurality of transistors and/or logical cells, wherein the interconnect portion comprises:
a plurality of interconnects; and
at least one dielectric layer;
a plurality of pillar interconnects coupled to the interconnect portion,
wherein the plurality of pillar interconnects are located over the substrate and the interconnect portion, and
wherein the plurality of pillar interconnects comprises:
a first plurality of pillar interconnects configured to provide electrical paths for ground, wherein the first plurality of pillar interconnects are arranged in at least one row of pillar interconnects, and
a second plurality of pillar interconnects configured to provide electrical paths for power, wherein the second plurality of pillar interconnects are arranged in at least one row of pillar interconnects, and
a plurality of interconnect structures coupled to and located over the interconnect portion, wherein the plurality of interconnect structures comprises a first plurality of interconnect structures configured to provide electrical paths for input/output signals,
wherein the first plurality of interconnect structures are arranged in at least one row of interconnect structures,
wherein the at least one row of interconnect structures from the first plurality of interconnect structures is located between (i) the at least one row of pillar interconnects from the first plurality of pillar interconnects and (ii) the at least one row of pillar interconnects from the second plurality of pillar interconnects,
wherein an interconnect structure from the plurality of interconnect structures, is located (i) entirely outside of the substrate, (ii) over the substrate and (iii) over the plurality of transistors and/or logical cells, such that the interconnect portion is located between the interconnect structure and the substrate, and
wherein the interconnect structure comprises:
an inner pillar interconnect;
a dielectric layer coupled to the inner pillar interconnect; and
an outer conductive layer coupled to the dielectric layer, wherein the outer conductive layer is configured to operate as a shield for the inner pillar interconnect.

2. The integrated device of claim 1, wherein each interconnect structure from the first plurality of interconnect structures comprises:
a respective inner pillar interconnect;
a respective dielectric layer coupled to the respective inner pillar interconnect; and
a respective outer conductive layer coupled to the respective dielectric layer.

3. The integrated device of claim 1, further comprising a solder interconnect directly coupled to the inner pillar interconnect of the interconnect structure.

4. The integrated device of claim 1, wherein the interconnect structure is configured to provide an electrical path for input/output (I/O) signals.

5. The integrated device of claim 4,
wherein the inner pillar interconnect is configured to provide an electrical path for the I/O signals, and
wherein the outer conductive layer is configured to shield I/O signals traveling through the inner pillar interconnect.

6. The integrated device of claim 1,
wherein the dielectric layer laterally surrounds the inner pillar interconnect and separates the outer conductive layer from the inner pillar interconnect, and
wherein the outer conductive layer is configured to be coupled to ground.

7. The integrated device of claim 1,
wherein the first plurality of pillar interconnects comprises a pillar interconnect located over the interconnect portion, and
wherein the pillar interconnect is configured to provide an electrical path for ground.

8. The integrated device of claim 7, further comprising a packaging interconnect coupled to the outer conductive layer and the pillar interconnect, such that the outer conductive layer is configured to be coupled to ground.

9. The integrated device of claim 1, wherein the integrated device is a wafer level package.

10. The integrated device of claim 1, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. An apparatus comprising:
a package substrate;
an integrated device coupled to the package substrate, wherein the integrated device includes a plurality of transistors; and
a plurality of pillar interconnects coupled to the package substrate, wherein the plurality of pillar interconnects comprises:
a first plurality of pillar interconnects configured to provide electrical paths for ground, wherein the first plurality of pillar interconnects are arranged in at least one row of pillar interconnects, and
a second plurality of pillar interconnects configured to provide electrical paths for power, wherein the second plurality of pillar interconnects are arranged in at least one row of pillar interconnects,
means for shielded interconnect coupled to the package substrate,
wherein the means for shielded interconnect is configured to provide an electrical path for a signal such that the signal is shielded as the signal travels through the means for shielded interconnect, and
wherein the means for shielded interconnect is located between the package substrate and the plurality of transistors and/or logical cells of the integrated device,
wherein the means for shielded interconnect comprises a first plurality of interconnect structures configured to provide electrical paths for input/output signals, wherein the first plurality of interconnect structures are arranged in at least one row of interconnect structures, and
wherein the at least one row of interconnect structures from the first plurality of interconnect structures is located between (i) the at least one row of pillar interconnects from the first plurality of pillar interconnects and (ii) the at least one row of pillar interconnects from the second plurality of pillar interconnects, and a plurality of solder interconnects coupled to the means for shielded interconnect.

12. The apparatus of claim 11, wherein the means for shielded interconnect comprises:
an inner pillar interconnect;
a dielectric layer coupled to the inner pillar interconnect; and
an outer conductive layer coupled to the dielectric layer, wherein the outer conductive layer is configured to operate as a shield for the inner interconnect,
wherein a solder interconnect from the plurality of solder interconnect is directly coupled to the inner pillar interconnect.

13. The apparatus of claim 12, wherein the dielectric layer laterally surrounds the inner interconnect and separates the outer conductive layer from the inner pillar interconnect.

14. The apparatus of claim 12,
wherein the inner interconnect is configured to provide an electrical path for input/output (I/O) signals, and
wherein the outer conductive layer is configured to shield I/O signals traveling through the inner pillar interconnect.

15. The apparatus of claim 12, wherein the outer conductive layer is configured to be coupled to ground.

16. The apparatus of claim 11,
wherein the first plurality of pillar interconnects comprises a pillar interconnect coupled to the package substrate, and
wherein the pillar interconnect is configured to provide an electrical path for ground.

17. The apparatus of claim 16, further comprising a substrate interconnect coupled to the pillar interconnect and an outer conductive layer of the means for shielded interconnect, such that the outer conductive layer is configured to be coupled to ground.

18. The apparatus of claim 11, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

19. A device comprising:
a substrate;
an integrated device coupled to the substrate; wherein the integrated device includes a plurality of transistors;
a plurality of pillar interconnects coupled to the package substrate, wherein the plurality of pillar interconnects comprises:
a first plurality of pillar interconnects configured to provide electrical paths for ground, wherein the first plurality of pillar interconnects are arranged in at least one row of pillar interconnects, and
a second plurality of pillar interconnects configured to provide electrical paths for power, wherein the second plurality of pillar interconnects are arranged in at least one row of pillar interconnects,
a plurality of interconnect structures coupled to the package substrate,
wherein the plurality of interconnect structures comprises a first plurality of interconnect structures configured to provide electrical paths for input/output signals, wherein the first plurality of interconnect structures are arranged in at least one row of interconnect structures,
wherein the at least one row of interconnect structures from the first plurality of interconnect structures is located between (i) the at least one row of pillar interconnects from the first plurality of pillar interconnects and (ii) the at least one row of pillar interconnects from the second plurality of pillar interconnects,
wherein an interconnect structure from the plurality of interconnect structures is configured to provide an electrical path for a signal such that the signal is shielded as the signal travels through the interconnect structure,
wherein the interconnect structure is located outside of the integrated device, and
wherein the interconnect structure comprises:
an inner pillar interconnect;
a dielectric layer coupled to the inner pillar interconnect; and
an outer conductive layer coupled to the dielectric layer, wherein the outer conductive layer is configured to operate as a shield for the inner pillar interconnect, and
at least one solder interconnect directly coupled to the inner pillar interconnect of the interconnect structure.

20. The device of claim 19, wherein the outer conductive layer is configured to be coupled to ground.

21. The device of claim 19,
wherein the first plurality of pillar interconnects comprises a pillar interconnect coupled to the package substrate, and
wherein the pillar interconnect is configured to provide an electrical path for ground.

22. The device of claim 21, further comprising a packaging interconnect coupled to the outer conductive layer and the pillar interconnect, such that the outer conductive layer is configured to be coupled to ground.

23. A integrated device, comprising:
a substrate comprising a plurality of transistors and/or logical cells;
an interconnect portion coupled to the substrate comprising the plurality of transistors and/or logical cells,
wherein the interconnect portion is located over the substrate and over the plurality of transistors and/or logical cells, and
wherein the interconnect portion comprises:
a plurality of interconnects; and
at least one dielectric layer;
a plurality of pillar interconnects coupled to the interconnect portion,
wherein the plurality of pillar interconnects are located over the substrate and the interconnect portion, and
wherein the plurality of pillar interconnects comprises:
a first plurality of pillar interconnects configured to provide electrical paths for ground, wherein the first plurality of pillar interconnects are arranged in at least one row of pillar interconnects, and
a second plurality of pillar interconnects configured to provide electrical paths for power, wherein the second plurality of pillar interconnects are arranged in at least one row of pillar interconnects, and a plurality of interconnect structures coupled to the interconnect portion,
  wherein the plurality of interconnect structures comprises a first plurality of interconnect structures configured to provide electrical paths for input/output signals, wherein the first plurality of interconnect structures are arranged in at least one row of interconnect structures,
  wherein the at least one row of interconnect structures from the first plurality of interconnect structures is located between (i) the at least one row of pillar interconnects from the first plurality of pillar interconnects and (ii) the at least one row of pillar interconnects from the second plurality of pillar interconnects,
  wherein at least one interconnect structure from the plurality of interconnect structures comprises:
    an inner pillar interconnect;
    a dielectric layer coupled to the inner pillar interconnect; and
    an outer conductive layer coupled to the dielectric layer, wherein the outer conductive layer is configured to operate as a shield for the inner pillar interconnect,
  wherein the interconnect structure is located over a surface of the substrate that includes the plurality of transistors and/or logical cells, and
  wherein the interconnect portion is located between the substrate and the plurality of interconnect structures.

24. The integrated device of claim 23,
wherein the plurality of interconnect structures comprises a second plurality of interconnect structures configured to provide electrical paths for input/output signals, wherein the second plurality of interconnect structures are arranged in at least one row of interconnect structures, and
wherein the at least one row of pillar interconnects from the second plurality of pillar interconnects is located between (i) the at least one row of interconnect structures from the first plurality of interconnect structures and (ii) the at least one row of interconnect structures from the second plurality of interconnect structures.

25. The integrated device of claim 24,
wherein the plurality of pillar interconnects comprises a third plurality of pillar interconnects configured to provide electrical paths for ground, wherein the third plurality of pillar interconnects are arranged in at least one row of pillar interconnects, and
wherein the at least one row of interconnect structures from the second plurality of interconnect structures is located between (i) the at least one row of pillar interconnects from the second plurality of pillar interconnects and (ii) the at least one row of pillar interconnects from the third plurality of pillar interconnects.

26. The integrated device of claim 23,
wherein the plurality of interconnect structures comprises a second plurality of interconnect structures configured to provide electrical paths for second input/output signals, wherein the second plurality of interconnect structures are arranged in at least one row of interconnect structures, and
wherein the at least one row of pillar interconnects from the first plurality of pillar interconnects is located between (i) the at least one row of interconnect structures from the first plurality of interconnect structures and (ii) the at least one row of interconnect structures from the second plurality of interconnect structures.

27. The integrated device of claim 26,
wherein the plurality of pillar interconnects comprises a third plurality of pillar interconnects configured to provide electrical paths for power, wherein the third plurality of pillar interconnects are arranged in at least one row of pillar interconnects, and
wherein the at least one row of interconnect structures from the second plurality of interconnect structures is located between (i) the at least one row of pillar interconnects from the first plurality of pillar interconnects and (ii) the at least one row of pillar interconnects from the third plurality of pillar interconnects.

28. The integrated device of claim 23,
wherein the first plurality of pillar interconnects are a first plurality of inner pillar interconnects from a second plurality of interconnect structures, and
wherein the second plurality of pillar interconnects are a second plurality of inner pillar interconnects from a third plurality of interconnect structures.

* * * * *